United States Patent
Jo et al.

(10) Patent No.: US 10,903,836 B2
(45) Date of Patent: Jan. 26, 2021

(54) RADIO-FREQUENCY SWITCH WITH VOLTAGE EQUALIZATION

(71) Applicant: Samsung Electro-Mechanics Co., Ltd., Suwon-si (KR)

(72) Inventors: Byeong Hak Jo, Suwon-si (KR); Yoo Sam Na, Suwon-si (KR); Hyun Paek, Suwon-si (KR); Sol A Kim, Suwon-si (KR); Jeong Hoon Kim, Suwon-si (KR); Jong Mo Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/832,404

(22) Filed: Mar. 27, 2020

(65) Prior Publication Data

US 2020/0403613 A1 Dec. 24, 2020

(30) Foreign Application Priority Data

Jun. 18, 2019 (KR) .................. 10-2019-0072027

(51) Int. Cl.
*H04B 1/04* (2006.01)
*H04B 1/44* (2006.01)
*H03K 17/687* (2006.01)
*H03K 17/693* (2006.01)

(52) U.S. Cl.
CPC ....... *H03K 17/693* (2013.01); *H03K 17/6874* (2013.01)

(58) Field of Classification Search
None
See application file for complete search history.

(56) References Cited

U.S. PATENT DOCUMENTS

| 7,613,442 | B1 | 11/2009 | Kelly et al. |
| 7,995,972 | B2* | 8/2011 | Nakajima .............. H03F 3/195 |
| | | | 455/83 |
| 9,923,594 | B2 | 3/2018 | Madan et al. |
| 10,270,437 | B2* | 4/2019 | Scott .................... H03K 17/145 |
| 2014/0118053 | A1* | 5/2014 | Matsuno ............. H03K 17/693 |
| | | | 327/427 |

FOREIGN PATENT DOCUMENTS

JP 2007-214825 A 8/2007

* cited by examiner

*Primary Examiner* — Kenneth B Wells
(74) *Attorney, Agent, or Firm* — NSIP Law

(57) ABSTRACT

A radio-frequency switch includes a first series switch including a plurality of series field-effect transistors (FETs) connected in series between a first terminal and a second terminal, a first shunt switch including a plurality of shunt FETs connected in series between the first terminal and a first ground terminal, and a first shunt gate resistor circuit including a plurality of gate resistors respectively connected to gates of the plurality of shunt FETs of the first shunt switch. Respective resistance values of the plurality of gate resistors of the first shunt gate resistor circuit successively increase in a direction away from the first ground terminal toward the first terminal.

25 Claims, 14 Drawing Sheets

RADIO-FREQUENCY SWITCH WITH VOLTAGE EQUALIZATION

CROSS-REFERENCE TO RELATED APPLICATIONS

This application claims the benefit under 35 USC 119(a) of Korean Patent Application No. 10-2019-0072027 filed on Jun. 18, 2019, in the Korean Intellectual Property Office, the entire disclosure of which is incorporated herein by reference for all purposes.

BACKGROUND

1. Field

This application relates to a radio-frequency switch having voltage equalization.

2. Description of Related Art

In general, a radio-frequency (RF) switch has a stacked structure or a series-shunt structure.

In field-effect transistors (FET) that are usually used in RF switches, a breakdown voltage (BV) is determined by a manufacturing process. A single FET does not have a BV that can withstand a high output voltage of a power amplifier (PA), so the RF switch is implemented with a stacked structure in which a plurality of FETs are connected in series.

As the number of stacked FETs is increased, the amount of power that can be handled by the RF switch increases. However, an insertion loss of the RF switch also increases, so the number of stacked FETs should be selected with this in mind.

If a single FET that has a BV high enough to handle a high power, the insertion loss will be reduced. However, an isolation provided by the RF switch will be reduced by a large parasitic capacitance of the FET in an OFF state of the FET, so a series-shunt structure may be used to provide better isolation than the single FET.

Such a series-shunt structure includes a series switch connected between an input terminal and an output terminal, and a shunt switch connected between the input terminal and a ground terminal. When the series switch is turned on, the shunt switch is turned off, and when the series switch is turned off, the shunt switch is turned on. An isolation between the input terminal and the output terminal is improved by using such a series-shunt structure.

When a plurality of FETs are stacked in an RF switch, it is preferable that the input voltage of the RF switch be uniformly distributed to the plurality of FETs. However, since leakage currents through gates and bodies of the FETs may vary among the FETs, the input voltage may not actually be evenly distributed to the plurality of FETs.

A drain-to-source breakdown voltage (BVDSS) of an FET, which is a maximum voltage across the drain and source of the FET that an FET can withstand, is determined by a manufacturing process. If the input voltage of the RF switch is not evenly distributed to the plurality of FETs in the stacked structure, it is necessary to increase the number of FETs in the stacked structure to ensure that the BVDSS of none of the FETs is exceeded, even though a fewer number of FETs is theoretically needed to withstand the input voltage of the RF switch.

However, as discussed above, as the number of stacked FETs increases, the insertion loss of the RF switch decreases.

To prevent such a problem, an RF switch having a stacked structure in which passive elements, such as capacitors, or resistors, or capacitors and resistors, are connected between bodies of stacked FETs has been proposed.

However, the RF switch having such a structure has problems in that the passive elements are needed to evenly distribute the input voltage of the RF switch to the plurality of FETs in the stacked structure, and the FETs in the stacked structure are vulnerable to electrostatic discharge (ESD) if the passive elements include capacitors.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect a radio-frequency switch includes a first series switch including a plurality of series field-effect transistors (FETs) connected in series between a first terminal and either a second terminal or a common node; a first shunt switch including a plurality of shunt FETs connected in series between the first terminal and a first ground terminal; and a first shunt gate resistor circuit including a plurality of gate resistors respectively connected to gates of the plurality of shunt FETs of the first shunt switch, wherein respective resistance values of the plurality of gate resistors of the first shunt gate resistor circuit successively increase in a direction away from the first ground terminal toward the first terminal.

Each of the plurality of gate resistors of the first shunt gate resistor circuit may have a resistance value determined by the following equation:

$$RG1$$

$$RGm = PV * RG(m-1)$$

In the above equation, m denotes a position number of an m-th shunt FET among the plurality of shunt FETs of the first shunt switch sequentially counted beginning with 1 from a shunt FET closest to the first terminal among the plurality of shunt FETs of the first shunt switch, where RGm is evaluated for m≥2, PV is less than 1, and successively decreases as m increases, RG1 denotes the resistance value of a gate resistor connected to the gate of the shunt FET closest to the first terminal among the plurality of gate resistors of the first shunt gate resistor circuit, and RGm denotes the resistance value of a gate resistor connected to the gate of the m-th shunt FET among the plurality of gate resistors of the first shunt gate resistor circuit.

Each of the plurality of gate resistors of the first shunt gate resistor circuit may have a resistance value determined by the following equation:

$$RG1$$

$$RGm = \{(2n-2m+1)/(2n-2m+3)\} * RG(m-1)$$

In the above equation, n denotes a total number of the plurality of shunt FETs of the first shunt switch, where n≥2, m denotes a position number of an m-th shunt FET among the n shunt FETs of the first shunt switch sequentially counted beginning with 1 from a shunt FET closest to the first terminal among the n shunt FETs, where RGm is evaluated for 2≤m≤n, RG1 denotes the resistance value of a gate resistor connected to the gate of the shunt FET closest to the first terminal among the plurality of gate resistors of the first shunt gate resistor circuit, and RGm denotes the resistance value of a gate resistor connected to the gate of the m-th shunt FET among the plurality of gate resistors of the first shunt gate resistor circuit.

The radio-frequency switch may further include a first shunt body resistor circuit including a plurality of body resistors respectively connected to bodies of the plurality of shunt FETs of the first shunt switch.

Respective resistance values of the plurality of body resistors of the first shunt body resistor circuit may successively increase in the direction away from the first ground terminal toward the first terminal.

Each of the plurality of body resistors of the first shunt body resistor circuit may have a resistance value determined by the following equation:

RB1

$$RBm=PV*RB(m-1)$$

In the above equation, m denotes a position number of an m-th shunt FET among the plurality of shunt FETs of the first shunt switch sequentially counted beginning with 1 from a shunt FET closest to the first terminal among the plurality of shunt FETs of the first shunt switch where RBm is evaluated for m≥2, PV is less than 1, and successively decreases as m increases, RB1 denotes the resistance value of a body resistor connected to the body of the shunt FET closest to the first terminal among the plurality of body resistors of the first shunt body resistor circuit, and RBm denotes the resistance value of a body resistor connected to the body of the m-th shunt FET among the plurality of body resistors of the first shunt body resistor circuit.

Each of the plurality of body resistors of the first shunt body resistor circuit may have a resistance value determined by the following equation:

RB1

$$RBm=\{(2n-2m+1)/(2n-2m+3)\}*RB(m-1)$$

In the above equation, n denotes a total number of the plurality of shunt FETs of the first shunt switch, where n≥2, m denotes a position number of an m-th shunt FET among the n shunt FETs of the first shunt switch sequentially counted beginning with 1 from a shunt FET closest to the first terminal among the n shunt FETs, where RBm is evaluated for 2≤m≤n, RB1 denotes the resistance value of a body resistor connected to the body of the shunt FET closest to the first terminal among the plurality of body resistors of the first shunt body resistor circuit, and RBm denotes the resistance value of a body resistor connected to the body of the m-th shunt FET among the plurality of body resistors of the first shunt body resistor circuit.

The plurality of series FETs of the first series switch may be connected in series between the first terminal and the common node, and the radio-frequency switch may further include a second series switch including a plurality of series FETs connected in series between the second terminal and the common node; a second shunt switch including a plurality of shunt FETs connected in series between the second terminal and a second ground terminal; a second shunt gate resistor circuit including a plurality of gate resistors respectively connected to gates of the plurality of shunt FETs of the second shunt switch; and a second shunt body resistor circuit including a plurality of body resistors respectively connected to bodies of the plurality of shunt FETs of the second shunt switch, wherein respective resistance values of the plurality of gate resistors of the second shunt gate resistor circuit may successively increase in a direction away from the second ground terminal toward the second terminal, and respective resistance values of the plurality of body resistors of the second shunt body resistor circuit may successively increase in the direction away from the second ground terminal toward the second terminal.

In another general aspect, a radio-frequency switch includes a first series switch including a plurality of series field-effect transistors (FETs) connected in series between a first terminal and either a second terminal or a common node; a first shunt switch including a plurality of shunt FETs connected in series between the first terminal and a first ground terminal; and a first shunt gate resistor circuit including: a plurality of gate resistors respectively connected between gates of the plurality of shunt FETs of the first shunt switch and a common connection node of the plurality of gate resistors of the first shunt gate resistor circuit; and a common gate resistor connected between the common connection node of the plurality of gate resistors of the first shunt gate resistor circuit and a first shunt gate voltage terminal, wherein a position of a gate resistor located at a center of the plurality of gate resistors of the first shunt gate resistor circuit is designated as a first reference position in response to a total number of the plurality of gate resistors of the first shunt gate resistor circuit being an odd number, and a center point located at the center of the plurality of gate resistors of the first shunt gate resistor circuit is designated as the first reference position in response to the total number of the plurality of gate resistors of the first shunt gate resistor circuit being an even number, respective resistance values of gate resistors located on a first terminal side of the first reference position among the plurality of gate resistors of the first shunt gate resistor circuit successively increase in a direction away from the first reference position toward the first terminal, and respective resistance values of gate resistors located on a first ground terminal side of the first reference position among the plurality of gate resistors of the first shunt gate resistor circuit successively increase in a direction away from the first reference position toward the first ground terminal.

Among the plurality of gate resistors of the first shunt gate resistor circuit, each of the gate resistors located on the first terminal side of the first reference position and each of the gate resistors located on the first ground terminal side of the first reference position may have a resistance value determined by the following equation:

RG1'

$$RGm'=PV'*RG(m'-1)$$

In the above equation, m' denotes a position number of an m'-th shunt FET among the plurality of shunt FETs of the first shunt switch sequentially counted beginning with 1 from a shunt FET closest to the first terminal among the plurality of shunt FETs of the first shunt switch toward the first reference position, and also sequentially counted beginning with 1 from a shunt FET closest to the first ground terminal among the plurality of shunt FETs of the first shunt switch toward the first reference position, where RGm' is evaluated for m≥2, PV' is less than 1, and successively decreases as m' increases, RG1' denotes the resistance value of a gate resistor connected to the gate of the shunt FET closest to the first terminal among the plurality of gate resistors of the first shunt gate resistor circuit, and also denotes the resistance value of a gate resistor connected to the gate of the shunt FET closest to the first ground terminal among the plurality of gate resistors of the first shunt gate resistor circuit, and RGm' denotes the resistance value of a gate resistor connected to the gate of the m'-th shunt FET located on the first terminal side of the first reference position among the plurality of gate resistors of the first shunt gate resistor circuit, and also denotes the resistance value of a gate resistor connected to the gate of the m'-th shunt FET located on the first ground terminal side of the first reference position among the plurality of gate resistors of the first shunt gate resistor circuit.

Among the plurality of gate resistors of the first shunt gate resistor circuit, each of the gate resistors located on the first terminal side of the first reference position and each of the gate resistors located on the first ground terminal side of the first reference position may have a resistance value determined by the following equation:

$$RG1'$$

$$RGm'=\{(2n'-2m'+1)/(2n'-2m'+3)\}*RG(m'-1)$$

In the above equation, n' denotes a total number of shunt FETs located on the first terminal side of the first reference position among the plurality of shunt FETs of the first shunt switch, and also denotes a total number of shunt FETs located on the first ground terminal side of the first reference position among the plurality of shunt FETs of the first shunt switch, where n'≥2, m' denotes a position number of an m'-th shunt FET among the n' shunt FETs located on the first terminal side of the first reference position sequentially counted beginning with 1 from a shunt FET closest to the first terminal among the shunt FETs of the first shunt switch toward the first reference position, and also denotes a position number of an m'-th shunt FET among the n' shunt FETs located on the first ground terminal side of the first reference position sequentially counted beginning with 1 from a shunt FET closest to the first ground terminal among the plurality of shunt FETs of the first shunt switch toward the first reference position, where RGm' is evaluated for 2≤m'≤n', RG1' denotes the resistance value of a gate resistor connected to the gate of the shunt FET closest to the first terminal among the plurality of gate resistors of the first shunt gate resistor circuit, and also denotes the resistance value of a gate resistor connected to the gate of the shunt FET closest to the first ground terminal among the plurality of gate resistors of the first shunt gate resistor circuit, and RGm' denotes the resistance value of a gate resistor connected to the gate of the m'-th shunt FET located on the first terminal side of the first reference position among the plurality of gate resistors of the first shunt gate resistor circuit, and also denotes the resistance value of a gate resistor connected to the gate of the m'-th shunt FET located on the first ground terminal side of the first reference position among the plurality of gate resistors of the first shunt gate resistor circuit.

The radio-frequency switch may further include a first shunt body resistor circuit including a plurality of body resistors respectively connected between bodies of the plurality of shunt FETs of the first shunt switch and a common connection node of the plurality of body resistors; and a common body resistor connected between the common connection node of the plurality of body resistors and a first shunt body voltage terminal.

A position of a body resistor located at a center of the plurality of body resistors of the first shunt body resistor circuit may be designated as a second reference position in response to a total number of the plurality of body resistors of the first shunt body resistor circuit being an odd number, and a center point located at the center of the plurality of body resistors of the first shunt body resistor circuit may be designated as the second reference position in response to the total number of the plurality of body resistors of the first shunt body resistor circuit being an even number, respective resistance values of body resistors located on a first terminal side of the second reference position among the plurality of body resistors may successively increase in a direction away from the second reference position toward the first terminal, and respective resistance values of body resistors located on a first ground terminal side of the second reference position among the plurality of body resistors may successively increase in a direction away from the second reference position toward the first ground terminal.

Among the plurality of body resistors of the first shunt body resistor circuit, each of the body resistors located on the first terminal side of the second reference position and each of the body resistors located on the first ground terminal side of the second reference position may have a resistance value determined by the following equation:

$$RB1'$$

$$RBm'=PV'*RB(m'-1)$$

In the above equation, m' denotes a position number of an m'-th shunt FET among the plurality of shunt FETs of the first shunt switch sequentially counted beginning with 1 from a shunt FET closest to the first terminal among the plurality of shunt FETs of the first shunt switch toward the second reference position, and also sequentially counted beginning with 1 from a shunt FET closest to the first ground terminal among the plurality of shunt FETs of the first shunt switch toward the second reference position, where RBm' is evaluated for m'≥2 PV' is less than 1, and successively decreases as m' increases, RB1' denotes the resistance value of a body resistor connected to the body of the shunt FET closest to the first terminal among the plurality of body resistors of the first shunt body resistor circuit, and also denotes the resistance value of a body resistor connected to the body of the shunt FET closest to the first ground terminal among the plurality of body resistors of the first shunt body resistor circuit, and RBm' denotes the resistance value of a body resistor connected to the body of the m'-th shunt FET located on the first terminal side of the second reference position among the plurality of body resistors of the first shunt body resistor circuit, and also denotes the resistance value of a body resistor connected to the body of the m'-th shunt FET located on the first ground terminal side of the second reference position among the plurality of body resistors of the first shunt body resistor circuit.

Among the plurality of body resistors of the first shunt body resistor circuit, each of the body resistors located on the first terminal side of the second reference position and each of the body resistors located on the first ground terminal side of the second reference position may have a resistance value determined by the following equation:

$$RB1'$$

$$RBm'=\{(2n'-2m'+1)/(2n'-2m'+3)\}*RB(m'-1)$$

In the above equation, n' denotes a total number of shunt FETs located on the first terminal side of the second reference position among the shunt FETs of the first shunt switch, and also denotes a total number of shunt FETs located on the first ground terminal side of the second reference position among the shunt FETs of the first shunt switch, where n'≥2, m' denotes a position number of an m'-th shunt FET among the n' shunt FETs located on the first terminal side of the second reference position sequentially counted beginning with 1 from a shunt FET closest to the first terminal toward the second reference position, and also denotes a position number of an m'-th shunt FET among the n' shunt FETs located on the first ground terminal side of the second reference position sequentially counted beginning with 1 from the shunt FET closest to the first ground terminal toward the second reference position, where RBm' is evaluated for 2≤m'≤n', RB1' denotes the resistance value of a body resistor connected to the body of the shunt FET closest to the first terminal among the plurality of body resistors of the first shunt body resistor circuit, and also denotes the resistance value of a body resistor connected to the body of the shunt FET closest to the first ground terminal among the plurality of body resistors of the first shunt body resistor circuit, and RBm' denotes the resistance value of a body resistor connected to the body of the m'-th shunt FET located on the first terminal side of the first reference position among the plurality of body resistors of the first shunt body resistor circuit, and also denotes the resistance value of a body resistor connected to the body of the m'-th shunt FET located on the first ground terminal side of the first reference position among the plurality of body resistors of the first shunt body resistor circuit.

The plurality of series FETs of the first series switch may be connected in series between the first terminal and the common node, and the radio-frequency switch may further include a second series switch including a plurality of series FETs connected in series between the second terminal and the common node; a second shunt switch including a plurality of shunt FETs connected in series between the second terminal and a second ground terminal; and a second shunt gate resistor circuit including a plurality of gate resistors respectively connected to gates of the plurality of shunt FETs of the second shunt switch, wherein a position of a gate resistor located at a center of the plurality of gate resistors of the second shunt gate resistor circuit may be designated as a third reference position in response to a total number of the plurality of gate resistors of the second shunt gate resistor circuit being an odd number, and a center point located at the center of the plurality of gate resistors of the second shunt gate resistor circuit may be designated as the third reference position in response to the total number of the plurality of gate resistors of the second shunt gate resistor circuit being an even number, respective resistance values of gate resistors located on a second terminal side of the third reference position among the plurality of gate resistors of the second shunt gate resistor circuit may successively increase in a direction away from the third reference position toward the second terminal, and respective resistance values of gate resistors located on a second ground terminal side of the third reference position among the plurality of gate resistors of the second shunt gate resistor circuit may successively increase in a direction away from the third reference position toward the second ground terminal.

The radio-frequency switch may further include a second shunt body resistor circuit including a plurality of body resistors respectively connected to bodies of the plurality of shunt FETs of the second shunt switch, wherein a position of a body resistor located at a center of the plurality of body resistors of the second shunt body resistor circuit may be designated as a fourth reference position in response to a total number of the plurality of body resistors of the second shunt body resistor circuit being an odd number, and a center point located at the center of the plurality of body resistors of the second shunt body resistor circuit may be designated as the fourth reference position in response to the total number of the plurality of body resistors of the second shunt body resistor circuit an even number, respective resistance values of body resistors located on a second terminal side of the fourth reference position among the plurality of body resistors of the second shunt body resistor circuit may successively increase in a direction away from the fourth reference position toward the second terminal, and respective resistance values of body resistors located on a second ground terminal side of the fourth reference position among the plurality of body resistors of the second shunt body resistor circuit may successively increase in a direction away from the fourth reference position toward the second ground terminal.

In another general aspect, a radio-frequency switch includes a series switch including a plurality of series field-effect transistors (FETs) connected in a series connection between a first terminal and either a second terminal or a common node; a shunt switch including a plurality of shunt FETs connected in a series connection between the first terminal and a first ground terminal; and a shunt gate resistor circuit including a plurality of gate resistors respectively connected between gates of the plurality of shunt FETs of the shunt switch and a shunt gate voltage terminal, wherein a respective resistance value of each gate resistor among the plurality of gate resistors depends on a total number of the plurality of shunt FETs, and a position of a corresponding shunt FET to which the gate resistor is connected among the plurality of shunt FETs in the series connection of the plurality of shunt FETs between the first terminal and the first ground terminal.

The respective resistance values of the plurality of gate resistors may successively decrease in a direction away from the first terminal toward the first ground terminal.

The radio-frequency switch may further include a shunt body resistor circuit including a plurality of body resistors respectively connected between bodies of the plurality of shunt FETs and a shunt body voltage terminal, wherein a respective resistance value of each body resistor among the plurality of body resistors may depend on the total number of the plurality of shunt FETs, and a position of a corresponding shunt FET to which the body resistor is connected among the plurality of shunt FETs in the series connection of the plurality of shunt FETs between the first terminal and the first ground terminal.

The respective resistance values of the plurality of body resistors may successively decrease in a direction away from the first terminal toward the first ground terminal.

In another general aspect, a radio-frequency switch includes a series switch including a plurality of series field-effect transistors (FETs) connected in a series connection between a first terminal and either a second terminal or a common node; a shunt switch including a plurality of shunt FETs connected in a series connection between the first terminal and a first ground terminal; and a shunt gate resistor circuit including a plurality of gate resistors respectively connected between gates of the plurality of shunt FETs and a common connection node of the plurality of gate resistors; and a common gate resistor connected between the common connection node of the plurality of gate resistors and a shunt gate voltage terminal, wherein a position of a gate resistor located at a center of the plurality of gate resistors is designated as a first reference position in response to a total number of the plurality of gate resistors being an odd number, and a center point located at the center of the plurality of gate resistors is designated as the first reference position in response to the total number of the plurality of gate resistors being an even number, a respective resistance value of each gate resistor located on a first terminal side of the first reference position among the plurality of gate resistors depends on a total number of shunt FETs connected in series on the first terminal side of the first reference position among the plurality of shunt FETs connected in the series connection between the first terminal and the first ground terminal, and a position of a corresponding shunt FET to which the gate resistor located on the first ground terminal side of the first reference position is connected among the shunt FETs connected in series on the first terminal side of the first reference position, and a respective resistance value of each gate resistor located on a first ground terminal side of the first reference position among the plurality of gate resistors depends on a total number of shunt FETs connected in series on the first ground terminal side of the first reference position among the plurality of shunt FETs connected in the series connection between the first terminal and the first ground terminal, and a position of a corresponding shunt FET to which the gate resistor located on the first ground terminal side of the first reference position is connected among the shunt FETs connected in series on the first ground terminal side of the first reference position.

The respective resistance values of the gate resistors located on the first terminal side of the first reference position may successively decrease in a direction away from the first terminal toward the first reference position, and the respective resistance values of the gate resistors located on the first ground terminal side of the first reference position may successively decrease in a direction away from the first ground terminal toward the first reference position.

The radio-frequency switch may further include a shunt body resistor circuit including a plurality of body resistors respectively connected between bodies of the plurality of shunt FETs and a common connection node of the plurality of body resistors; and a common body resistor connected between the common connection node of the plurality of body resistors and a shunt body voltage terminal, wherein a position of a body resistor located at a center of the plurality of body resistors may be designated as a second reference position in response to a total number of the plurality of body resistors being an odd number, and a center point located at the center of the plurality of body resistors may be designated as the second reference position in response to the total number of the plurality of body resistors being an even number, a respective resistance value of each body resistor located on a first terminal side of the second reference position among the plurality of body resistors may depend on a total number of shunt FETs connected in series on the first terminal side of the second reference position among the plurality of shunt FETs connected in the series connection between the first terminal and the first ground terminal, and a position of a corresponding shunt FET to which the body resistor located on the first ground terminal side of the second reference position is connected among the shunt FETs connected in series on the first terminal side of the second reference position, and a respective resistance value of each body resistor located on a first ground terminal side of the second reference position among the plurality of body resistors may depend on a total number of shunt FETs connected in series on the first ground terminal side of the second reference position among the plurality of shunt FETs connected in the series connection between the first terminal and the first ground terminal, and a position of a corresponding shunt FET to which the body resistor located on the first ground terminal side of the second reference position is connected among the shunt FETs connected in series on the first ground terminal side of the second reference position.

The respective resistance values of the body resistors located on the first terminal side of the second reference position may successively decrease in a direction away from the first terminal toward the second reference position, and the respective resistance values of the body resistors located on the first ground terminal side of the second reference position may successively decrease in a direction away from the first ground terminal toward the second reference position.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
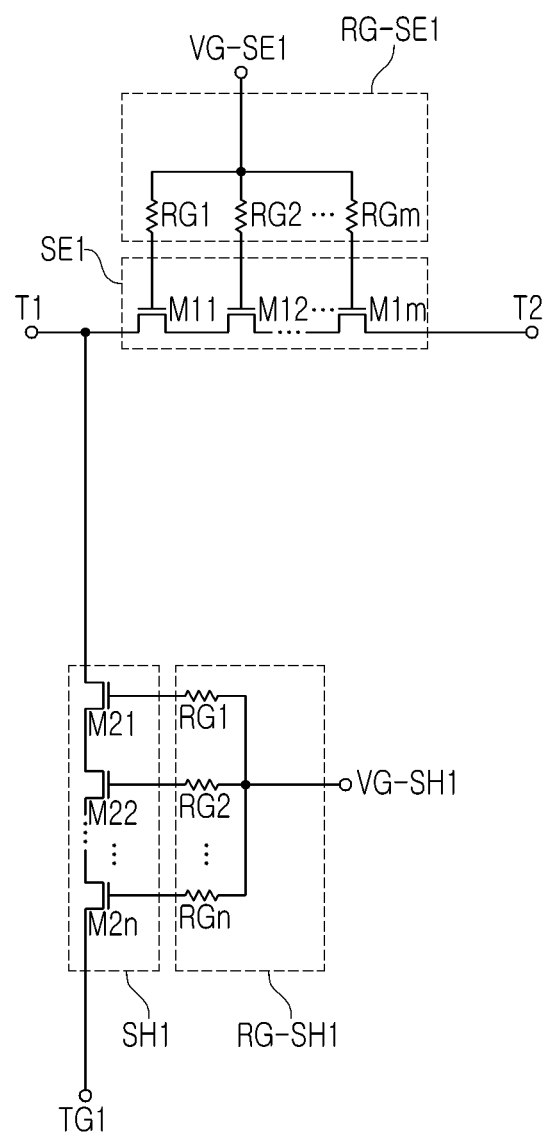
FIG. 1 is a circuit diagram of an example of a radio-frequency switch including individual gate resistors.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Figure 2:
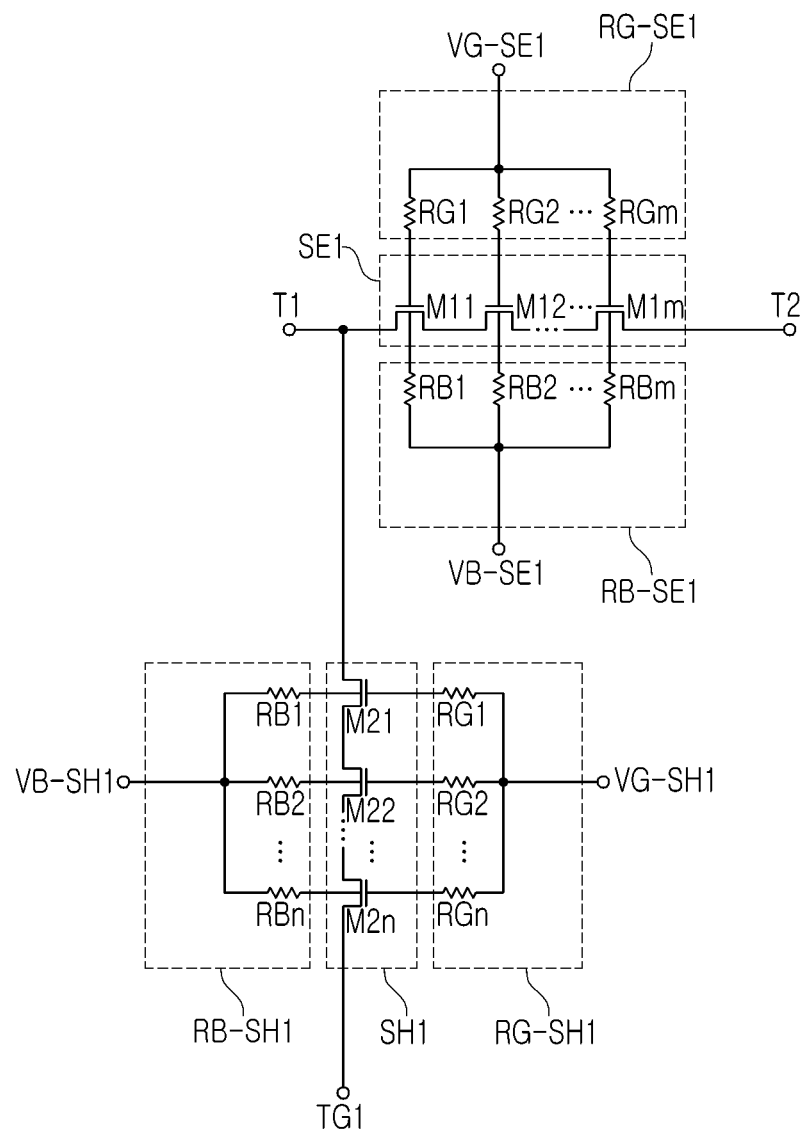
FIG. 2 is a circuit diagram of an example of a radio-frequency switch including individual gate resistors and individual body resistors.

FIG. 1 is a circuit diagram of an example of a radio-frequency switch including individual gate resistors, and FIG. 2 is a circuit diagram of an example of a radio-frequency switch including individual gate resistors and individual body resistors.

Referring to FIG. 1, a radio-frequency switch includes a first series switch SE1, a first shunt switch SH1, a first series gate resistor circuit RG-SE1, and a first shunt gate resistor circuit RG-SH1. When the first series switch SE1 is turned on, the first shunt switch SH1 is turned off. When the first series switch SE1 is turned off, the first shunt switch SH1 is turned on.

The first series switch SE1 includes a plurality of series FETs M11 to M1$m$ (where m is a natural number of 2 or more) connected in series between a first terminal T1 and a second terminal T2. Thus, m denotes a total number of the series FETs stacked in the first series switch SE1, i.e., a total number of the stacked series FETs in the first series switch SE1. In this application, the term "series FET" denotes an FET that is connected in series with at least one other FET between two terminals, neither of which is a ground terminal.

The first shunt switch SH1 includes a plurality of shunt FETs M21 to M2$n$ (where n is a natural number of 2 or more) connected in series between the first terminal T1 and a first ground terminal TG1. Thus, n denotes a total number of the shunt FETs stacked in the first shunt switch SH1, i.e., a total number of the stacked shunt FETs in the first shunt switch SH1. In this application, the term "shunt FET" denotes an FET that is connected in series with at least one other FET between a terminal and a ground terminal.

The first series gate resistor circuit RG-SE1 includes a plurality of gate resistors RG1 to RGm respectively connected between gates of the plurality of series FETs M11 to M1$m$ of the first series switch SE1 and a first series gate voltage terminal VG-SE1.

The first shunt gate resistor circuit RG-SH1 includes a plurality of gate resistors RG1 to RGn respectively connected between gates of the plurality of shunt FETs M21 to M2$n$ of the first shunt switch SH1 and a first shunt gate voltage terminal VG-SH1.

In the descriptions of subsequent drawings, descriptions of components having the same reference numerals may have been omitted to avoid redundancy, and only differences between the drawings may have been described.

Referring to FIG. 2, a radio-frequency switch has the circuit structure of FIG. 1, and further includes a first series body resistor circuit RB-SE1 and a first shunt body resistor circuit RB-SH1.

The first series body resistor circuit RB-SE1 includes a plurality of body resistors RB1 to RBm respectively connected between bodies of the plurality of series FETs M11 to M1m of the first series switch SE1 and a first series body voltage terminal VB-SE1.

The first shunt body resistor circuit RB-SH1 includes a plurality of body resistors RB1 to RBn respectively connected between bodies of the plurality of shunt FETs M21 to M2n of the first shunt switch SH1 and a first shunt body voltage terminal VB-SH1.

Referring to FIGS. 1 and 2, respective resistance values of the plurality of gate resistors RG1 to RGn of the first shunt gate resistor circuit RG-SH1 successively increase in a direction away from the first ground terminal TG1 toward the first terminal T1. That is, the gate resistor RGn connected to the first ground terminal TG1 has the smallest resistance value, the gate resistor RG1 connected to the first terminal T1 has the greatest resistance value, and the respective resistance values of the plurality of gate resistors RG1 to RGn successively increase from the gate resistor RGn to the gate resistor RG1. In other words, the respective resistance values of the plurality of gate resistors RG1 to RGn of the first shunt gate resistor circuit RG-SH1 successively decrease in a direction away from the first terminal T1 toward the first ground terminal TG1.

Also, respective resistance values of the plurality of body resistors RB1 to RBn of the first shunt body resistor circuit RB-SH1 successively increase in a direction away from the first ground terminal TG1 toward the first terminal T1. That is, the body resistor RBn connected to the first ground terminal TG1 has the smallest resistance value, the body resistor RB1 connected to the first terminal T1 has the greatest resistance value, and the respective resistance values of the plurality of body resistors RB1 to RBn successively increase from the body resistor RBn to the body resistor RB1. In other words, the respective resistance values of the plurality of body resistors RB1 to RBn of the first shunt body resistor circuit RB-SH1 successively decrease in a direction away from the first terminal T1 toward the first ground terminal TG1.

Figure 3:
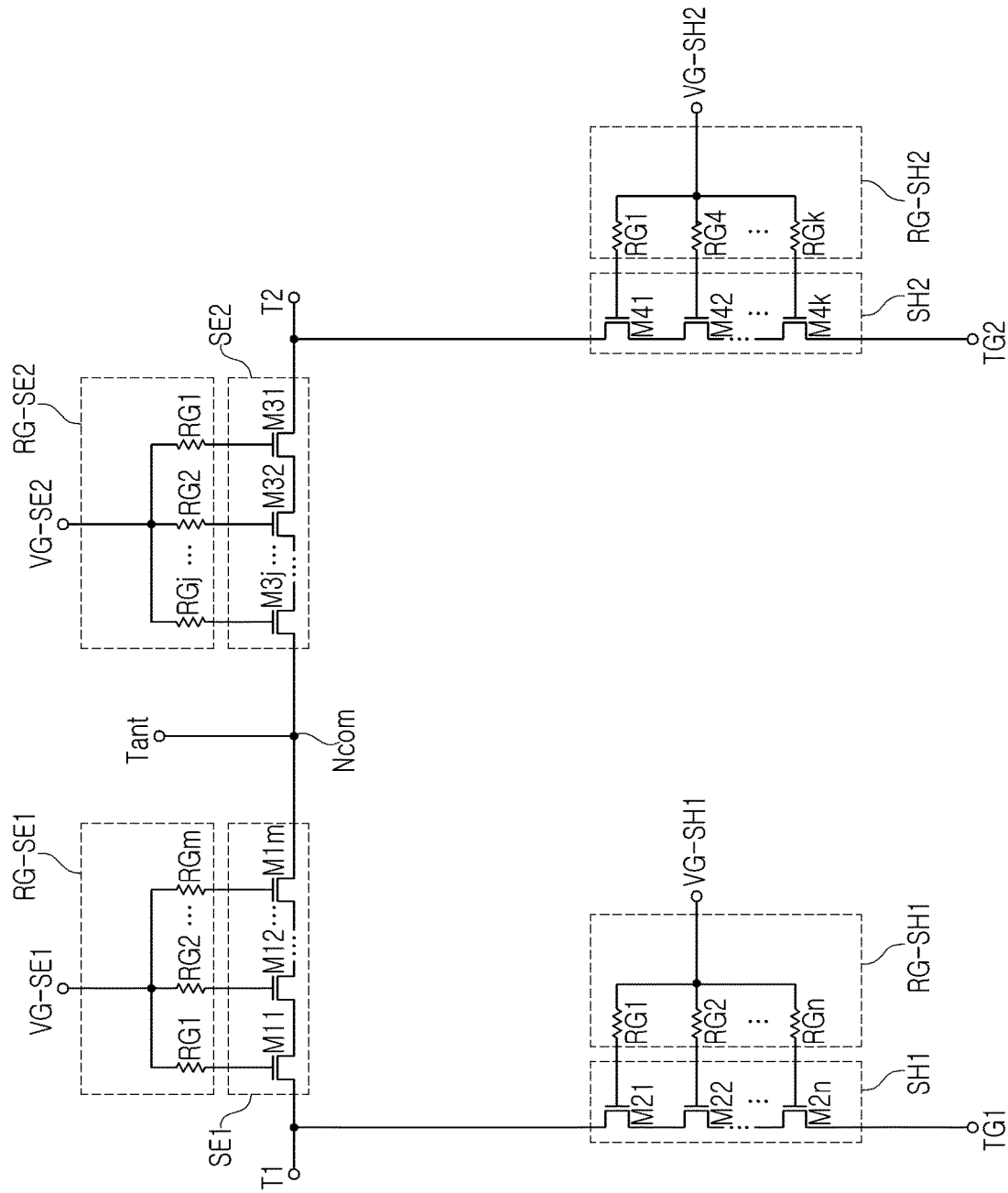
FIG. 3 is a circuit diagram of an example of a single-pole double-throw (SPDT) radio-frequency switch including individual gate resistors.
Figure 4:
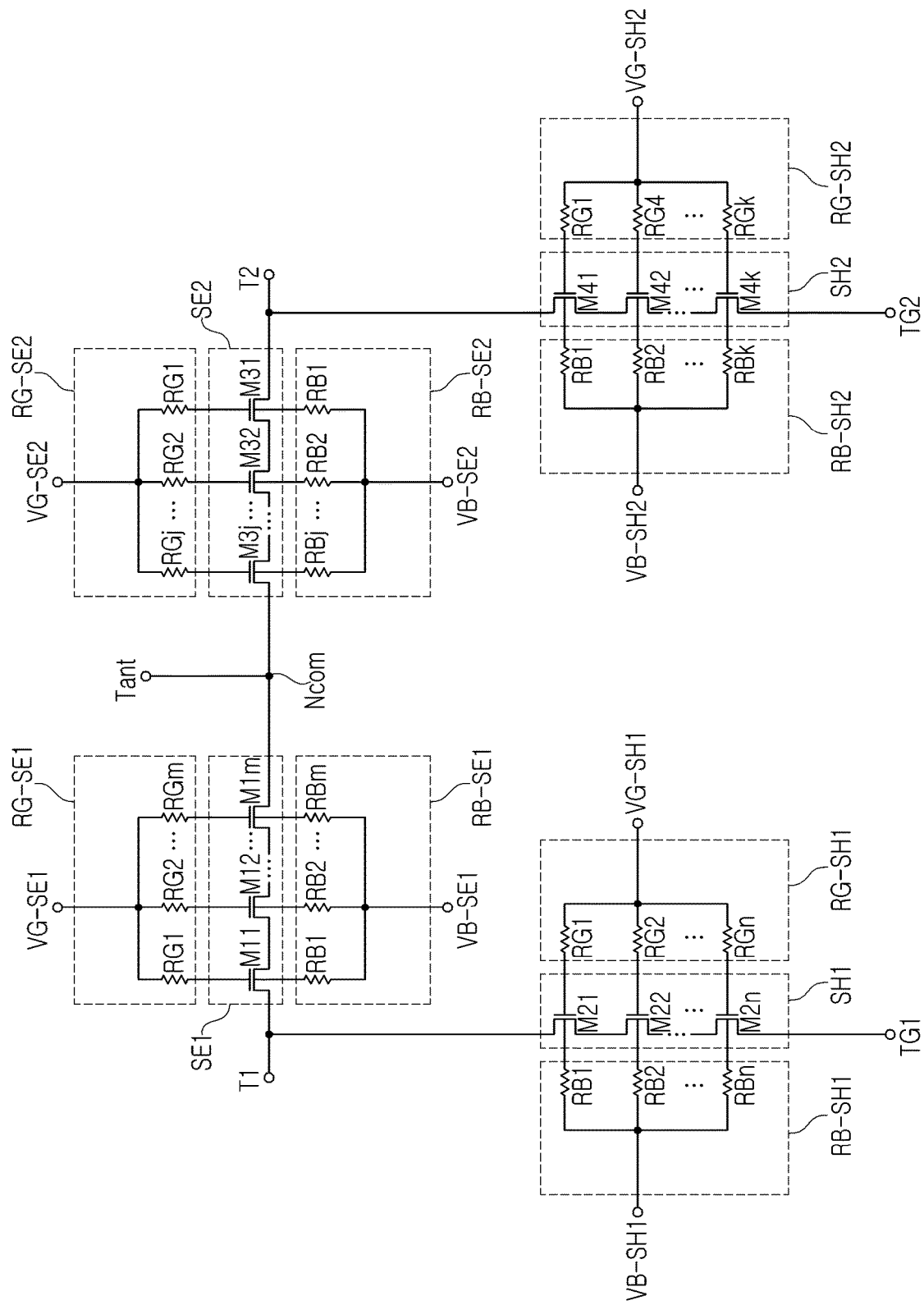
FIG. 4 is a circuit diagram of an example of an SPDT radio-frequency switch including individual gate resistors and individual body resistors.

FIG. 3 is a circuit diagram of an example of a single-pole double-throw (SPDT) radio-frequency switch including individual gate resistors, and FIG. 4 is a circuit diagram of an example of an SPDT radio-frequency switch including individual gate resistors and individual body resistors.

Referring to FIG. 3, an SPDT radio-frequency switch has the circuit structure of FIG. 1, except that the plurality of series FETs M11 to M1m of the first series switch SE1 are connected in series between the first terminal T1 and a common node Ncom, and further includes a second series switch SE2, a second shunt switch SH2, a second series gate resistor circuit RG-SE2, and a second shunt gate resistor circuit RG-SH2. A terminal Tant is connected to the common node Ncom, and may be connected to an antenna of a smartphone or other mobile device having a wireless communication capability. The first series switch SE1 and the second shunt switch SH2 are turned on and off at the same time, and the first shunt switch SH1 and the second series switch SE2 are turned on and off at the same time. When the first series switch SE1 and the second shunt switch SH2 are turned on, the first shunt switch SH1 and the second series switch SE2 are turned off. When the first series switch SE1 and the second shunt switch SH2 are turned off, the first shunt switch SH1 and the second series switch SE2 are turned on.

The second series switch SE2 includes a plurality of series FETs M31 to M3j (where j is a natural number of 2 or more) connected in series between the second terminal T2 and the common node Ncom. Thus, j is a total number of the series FETs stacked in the second series switch SE2, i.e., a total number of the stacked series FETs in the second series switch SE2.

The second shunt switch SH2 includes a plurality of shunt FETs M41 to M4k (where k is a natural number of 2 or more) connected in series between the second terminal T2 and a second ground terminal TG2. Thus, k is a total number of the shunt FETs stacked in the second shunt switch SH2, i.e., a total number of the stacked shunt FETs in the second shunt switch SH2.

The second series gate resistor circuit RG-SE2 includes a plurality of gate resistors RG1 to RGj respectively connected between gates of the plurality of series FETs M31 to M3j of the second series switch SE2 and a second series gate voltage terminal VG-SE2.

The second shunt gate resistor circuit RG-SH2 includes a plurality of gate resistors RG1 to RGk respectively connected between gates of the plurality of shunt FETs M41 to M4k of the second shunt switch SH2 and a second shunt gate voltage terminal VG-SH2.

Referring to FIG. 4, an SPDT radio-frequency switch has the circuit structure of FIG. 2, and further includes a second series body resistor circuit RB-SE2 and a second shunt body resistor circuit RB-SH2.

The second series body resistor circuit RB-SE2 includes a plurality of body resistors RB1 to RBj respectively connected between bodies of the plurality of series FETs M31 to M3j of the second series switch SE2 and a second series body voltage terminal VB-SE2.

The second shunt body resistor circuit RB-SH2 includes a plurality of body resistors RB1 to RBk respectively connected between bodies of the plurality of shunt FETs M41 to M4k of the second shunt switch SH2 and a second shunt body voltage terminal VB-SH2.

Referring to FIGS. 3 and 4, respective resistance values of the plurality of gate resistors RG1 to RGk of the second shunt gate resistor circuit RG-SH2 successively increase in a direction away from the second ground terminal TG2 toward the second terminal T2.

Also, respective resistance values of the plurality of body resistors RB1 to RBk of the second shunt body resistor circuit RB-SH2 successively increase in a direction away from the second ground terminal TG2 toward the second terminal T2.

Referring to FIGS. 1 to 4, each of the plurality of gate resistors RG1 to RGn of the first shunt gate resistor circuit RG-SH1 has a resistance value determined by Equation 1 below.

RG1

$$RGm = PV*RG(m-1) \qquad (1)$$

In Equation 1, m denotes a position number of an m-th shunt FET among the plurality of shunt FETs M21 to M2n of the first shunt switch SH1 sequentially counted beginning with 1 from the shunt FET M21 closest to the first terminal T1, where RGm is evaluated for m≥2. PV is less than 1, and successively decreases as m increases. PV is not an abbreviation of anything. RG1 denotes the resistance value of the gate resistor RG1 connected to the gate of the shunt FET M21 closest to the first terminal T1 among the plurality of gate resistors RG1 to RGn of the first shunt gate resistor circuit RG-SH1. RGm denotes the resistance value of a gate resistor connected to the gate of the m-th shunt FET among the plurality of gate resistors RG1 to RGn of the first shunt gate resistor circuit RG-SH1. Note that m in Equation 1 is not the same as m in RGm in the plurality of gate resistors RG1 to RGm of the first series gate resistor circuit RG-SE1 in FIGS. 1 to 4, which denotes a total number of the series FETs in the plurality of series FETs M11 to M1m of the first series switch SE1.

More specifically, each of the plurality of gate resistors RG1 to RGn of the first shunt gate resistor circuit RG-SH1 has a resistance value determined by Equation 2 below.

RG1

$$RGm=\{(2n-2m+1)/(2n-2m+3)\}*RG(m-1) \quad (2)$$

In Equation 2, n denotes a total number of the plurality of shunt FETs M21 to M2n of the first shunt switch SH1, that is, a total number of stacked shunt FETs in the first shunt switch SH1, where n≥2. m denotes a position number of an m-th shunt FET among the n shunt FETs M21 to M2n of the first shunt switch SH1 sequentially counted beginning with 1 from the shunt FET M21 closest to the first terminal T1, where RGm is evaluated for 2≤m≤n. RG1 denotes the resistance value of the gate resistor RG1 connected to the gate of the shunt FET M21 closest to the first terminal T1 among the plurality of gate resistors RG1 to RGn of the first shunt gate resistor circuit RG-SH1. RGm denotes the resistance value of a gate resistor connected to the gate of the m-th shunt FET among the plurality of gate resistors RG1 to RGn of the first shunt gate resistor circuit RG-SH1. {(2n−2m+1)/(2n−2m+3)} corresponds to PV in Equation 1. Thus, PV is a function of m and n.

For example, when n=5, that is, when the first shunt switch SH1 includes 5 stacked shunt FETs M21 to M25 and 5 gate resistors RG1 to RG5, each of the gate resistors RG1 to RG5 has a resistance value determined by Equation 3 below.

RG1

$$RG2=(2n-2m+1)/(2n-2m+3)*RG1=(10-4+1)/(10-4+3)*RG1=(7/9)*RG1$$

$$RG3=(2n-2m+1)/(2n-2m+3)*RG2=(10-6+1)/(10-6+3)*RG1=(5/7)*RG2$$

$$RG4=(2n-2m+1)/(10-2m+3)*RG1=(10-8+1)/(10-8+3)*RG1=(3/5)*RG3$$

$$RG5=(2n-2n+1)/(2n-2m+3)*RG2=(10-10+1)/(10-10+3)*RG1=(1/3)*RG4 \quad (3)$$

According to Equation 3, for RG1=1000 kΩ, RG1=1000 kΩ, RG2=(7/9)*1000 kΩ=778 kΩ, RG3=(5/7)*778 kΩ=556 kΩ, RG4=(3/5)*556 kΩ=333 kΩ, and RG5=(1/3)*333 kΩ=111 kΩ.

Equations 1 and 2 above that are applicable to the plurality of gate resistors RG1 to RGn of the first shunt gate resistor circuit RG-SH1 in FIGS. 1 to 4 are also applicable to the plurality of gate resistors RG1 to RGk of the second shunt gate resistor circuit RG-SH2 in FIGS. 3 and 4.

Furthermore, referring to FIGS. 2 and 4, each of the plurality of body resistors RB1 to RBn of the first shunt body resistor circuit RB-SH1 has a resistance value determined by Equation 4 below.

RB1

$$RBm=PV*RB(m-1) \quad (4)$$

In Equation 4, m denotes a position number of an m-th shunt FET among the plurality of shunt FETs M21 to M2n of the first shunt switch SH1 sequentially counted beginning with 1 from the shunt FET M21 closest to the first terminal T1, where RBm is evaluated for m≥2. PV is less than 1, and successively decreases as m increases. PV is not an abbreviation of anything. RB1 denotes the resistance value of the body resistor RB1 connected to the body of the shunt FET M21 closest to the first terminal T1 among the plurality of body resistors RB1 to RBn of the first shunt body resistor circuit RB-SH1. RBm denotes the resistance value of a body resistor connected to the body of the m-th shunt FET among the plurality of body resistors RB1 to RBn of the first shunt body resistor circuit RB-SH1. Note that m in Equation 4 is not the same as m in RBm in the plurality of body resistors RB1 to RBm of the first series body resistor circuit RB-SE1 in FIGS. 2 and 4, which denotes a total number of the series FETs in the plurality of series FETs M11 to M1m of the first series switch SE1.

More specifically, each of the plurality of body resistors RB1 to RBn of the first shunt body resistor circuit RB-SH1 has a resistance value determined by Equation 5 below.

RB1

$$RBm=\{(2n-2m+1)/(2n-2m+3)\}*RB(m-1) \quad (5)$$

In Equation 5, n denotes a total number of the plurality of shunt FETs M21 to M2n of the first shunt switch SH1, that is, a total number of stacked shunt FETs in the first shunt switch SH1, where n≥2. m is a position number of an m-th shunt FET among the n shunt FETs M21 to M2n of the first shunt switch SH1 sequentially counted beginning with 1 from the shunt FET M21 closest to the first terminal T1, where RBm is evaluated for 2≤m≤n. RB1 denotes the resistance value of the body resistor RB1 connected to the body of the shunt FET M21 closest to the first terminal T1 among the plurality of body resistors RB1 to RBn of the first shunt body resistor circuit RB-SH1. RBm denotes the resistance value of a body resistor connected to the body of the m-th shunt FET among the plurality of body resistors RB1 to RBn of the first shunt body resistor circuit RB-SH1. {(2n−2m+1)/(2n−2m+3)} corresponds to PV in Equation 4. Thus, PV is a function of m and n.

Equations 4 and 5 above that are applicable to the plurality of body resistors RB1 to RBn of the first shunt body resistor circuit RB-SH1 in FIGS. 2 and 4 are also applicable to the plurality of body resistors RB1 to RBk of the second shunt body resistor circuit RB-SH2 in FIG. 4.

Figure 5:
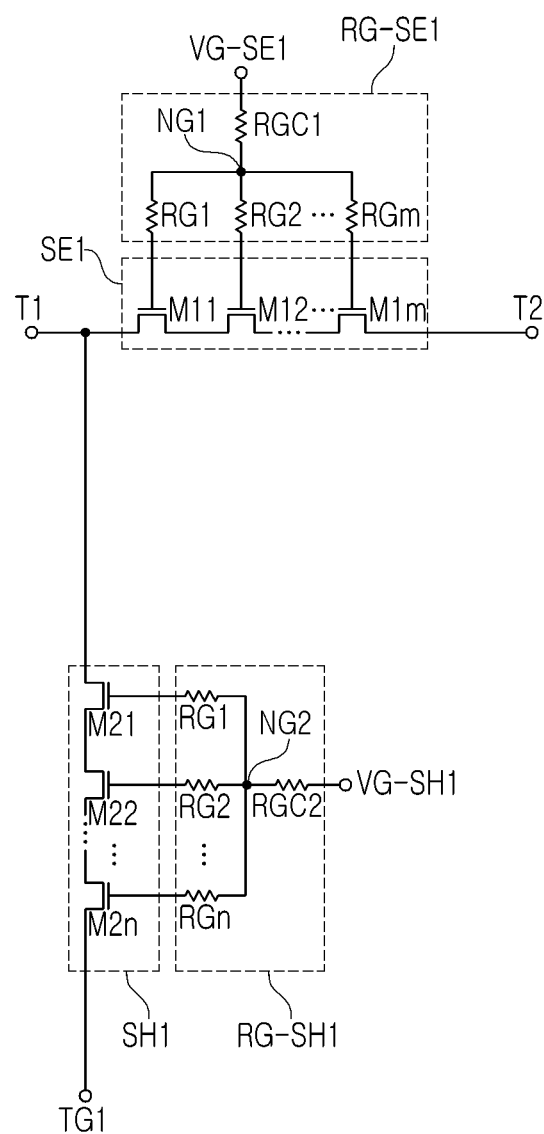
FIG. 5 is a circuit diagram of an example of a radio-frequency switch including individual gate resistors and a common gate resistor.
Figure 6:
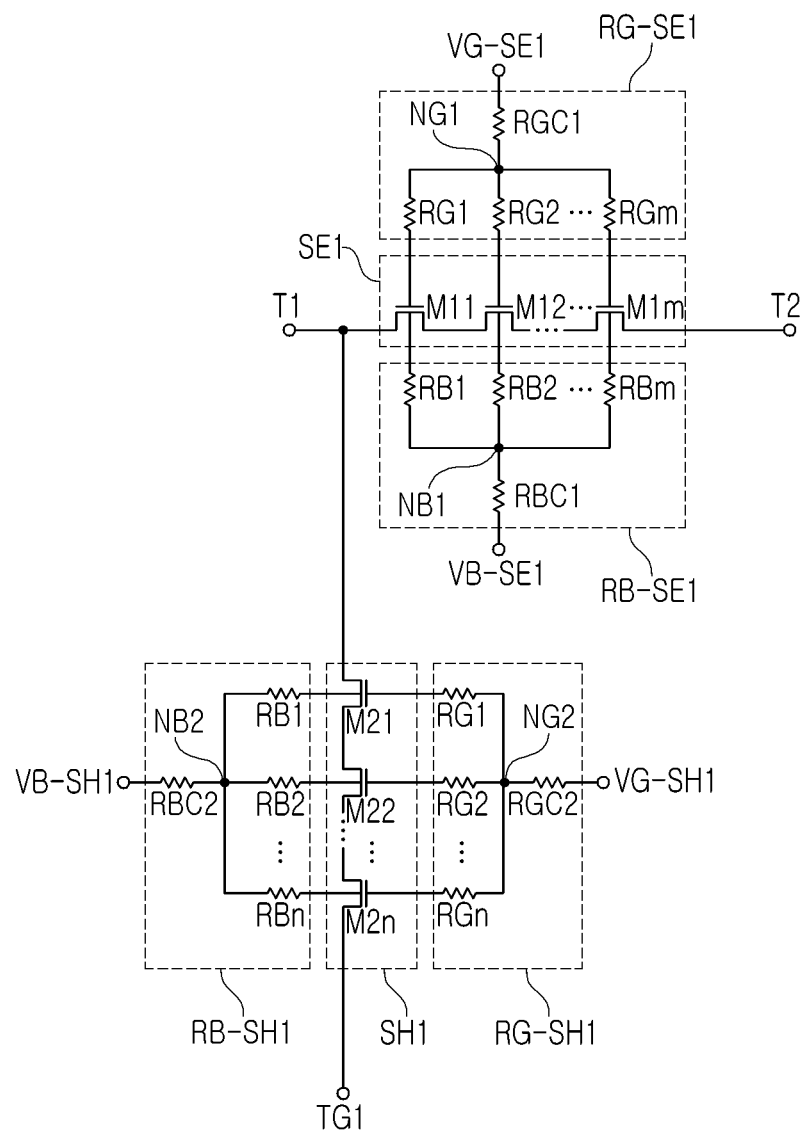
FIG. 6 is a circuit diagram of an example of a radio-frequency switch including individual gate resistors, individual body resistors, a common gate resistor, and a common body resistor.

FIG. 5 is a circuit diagram of an example of a radio-frequency switch including individual gate resistors and a common gate resistor, and FIG. 6 is a circuit diagram of an example of a radio-frequency switch including individual gate resistors, individual body resistors, a common gate resistor, and a common body resistor.

Referring to FIG. 5, a radio-frequency switch includes a first series switch SE1, a first shunt switch SH1, a first series gate resistor circuit RG-SE1, and a first shunt gate resistor circuit RG-SH1. When the first series switch SE1 is turned on, the first shunt switch SH1 is turned off. When the first series switch SE1 is turned off, the first shunt switch SH1 is turned on.

The first series switch SE1 includes a plurality of series FETs M11 to M1m (where m is a natural number of 2 or more) connected in series between a first terminal T1 and a second terminal T2. Thus, m denotes a total number of the series FETs stacked in the first series switch SE1, i.e., a total number of the stacked series FETs in the first series switch SE1.

The first shunt switch SH1 includes a plurality of shunt FETs M21 to M2$n$ (where n is a natural number of 2 or more) connected in series between the first terminal T1 and a first ground terminal TG1. Thus, n denotes a total number of the shunt FETs stacked in the first shunt switch SH1, i.e., a total number of the stacked shunt FETs in the first shunt switch SH1.

The first series gate resistor circuit RG-SE1 includes a plurality of gate resistors RG1 to RGm respectively connected between gates of the plurality of series FETs M11 to M1$m$ of the first series switch SE1 and a common connection node NG1 of the plurality of gate resistors RG1 to RGm, and a common gate resistor RGC1 connected between the common connection node NG1 and a first series gate voltage terminal VG-SE1.

The first shunt gate resistor circuit RG-SH1 includes a plurality of gate resistors RG1 to RGn respectively connected between gates of the plurality of shunt FETs M21 to M2$n$ of the first shunt switch SH1 and a common connection node NG2 of the plurality of gate resistors RG1 to RGn, and a common gate resistor RGC2 connected between the common connection node NG2 and a first shunt gate voltage terminal VG-SH1.

Referring to FIG. 6, a radio-frequency switch has the circuit structure of FIG. 5, and further includes a first series body resistor circuit RB-SE1 and a first shunt body resistor circuit RB-SH1.

The first series body resistor circuit RB-SE1 includes a plurality of body resistors RB1 to RBm respectively connected between bodies of the plurality of series FETs M11 to M1$m$ of the first series switch SE1 and a common connection node NB1 of the plurality of body resistors RB1 to RBm, and a common body resistor RBC1 connected between the common connection node NB1 and a first series body voltage terminal VB-SE1.

The first shunt body resistor circuit RB-SH1 includes a plurality of body resistors RB1 to RBn respectively connected between bodies of the plurality of shunt FETs M21 to M2$n$ of the first shunt switch SH1 and a common connection node NB2 of the plurality of body resistors RB1 to RBn, and a common body resistor RBC2 connected between the common connection node NB2 and a first shunt body voltage terminal VB-SH1.

Referring to FIGS. 5 and 6, when a total number of the plurality of gate resistors RG1 to RGn of the first shunt gate resistor circuit RG-SH1 is an odd number, a position of a gate resistor located at a center of the plurality of gate resistors RG1 to RGn, i.e., a position of a center gate resistor of the plurality of gate resistors RG1 to RGn, is designated as a first reference position. Conversely, when the total number of the plurality of gate resistors RG1 to RGn is an even number, a center point located at the center of the plurality of gate resistors RG1 to RGn is designated as the first reference position. In either case, a total number of gate resistors located on a first terminal T1 side of the first reference position among the plurality of gate resistors RG1 to RGn is equal to a total number of gate resistors located on a first ground terminal TG1 side of the first reference position among the plurality of gate resistors RG1 to RGn. Respective resistance values of the gate resistors located on the first terminal T1 side of the first reference position successively increase in a direction away from the first reference position toward the first terminal T1, and respective resistance values of the gate resistors located on the first ground terminal TG1 side of the first reference position successively increase in a direction away from the first reference position toward the first ground terminal TG1.

Referring to FIG. 6, when a total number of the plurality of body resistors RB1 to RBn of the first shunt body resistor circuit RB-SH1 is an odd number, a body resistor located at a center of the plurality of body resistors RB1 to RBn, i.e., a position of a center body resistor of the plurality of body resistors RB1 to RBn, is designated as a second reference position. Conversely, when the total number of the plurality of body resistors RB1 to RBn is an even number, a center point located at the center of the plurality of body resistors RB1 to RBn is designated as the second reference position. In either case, a total number of body resistors located on a first terminal T1 side of the second reference position among the plurality of body resistors RB1 to RBn is equal to a total number of body resistors located on a first ground terminal TG1 side of the second reference position among the plurality of body resistors RB1 to RBn. Respective resistance values of the body resistors located on the first terminal T1 side of the second reference position successively increase in a direction away from the second reference position toward the first terminal T1, and respective resistance values of the body resistors located on the first ground terminal TG1 side of the second reference position successively increase in a direction away from the second reference position toward the first ground terminal TG1.

Figure 7:
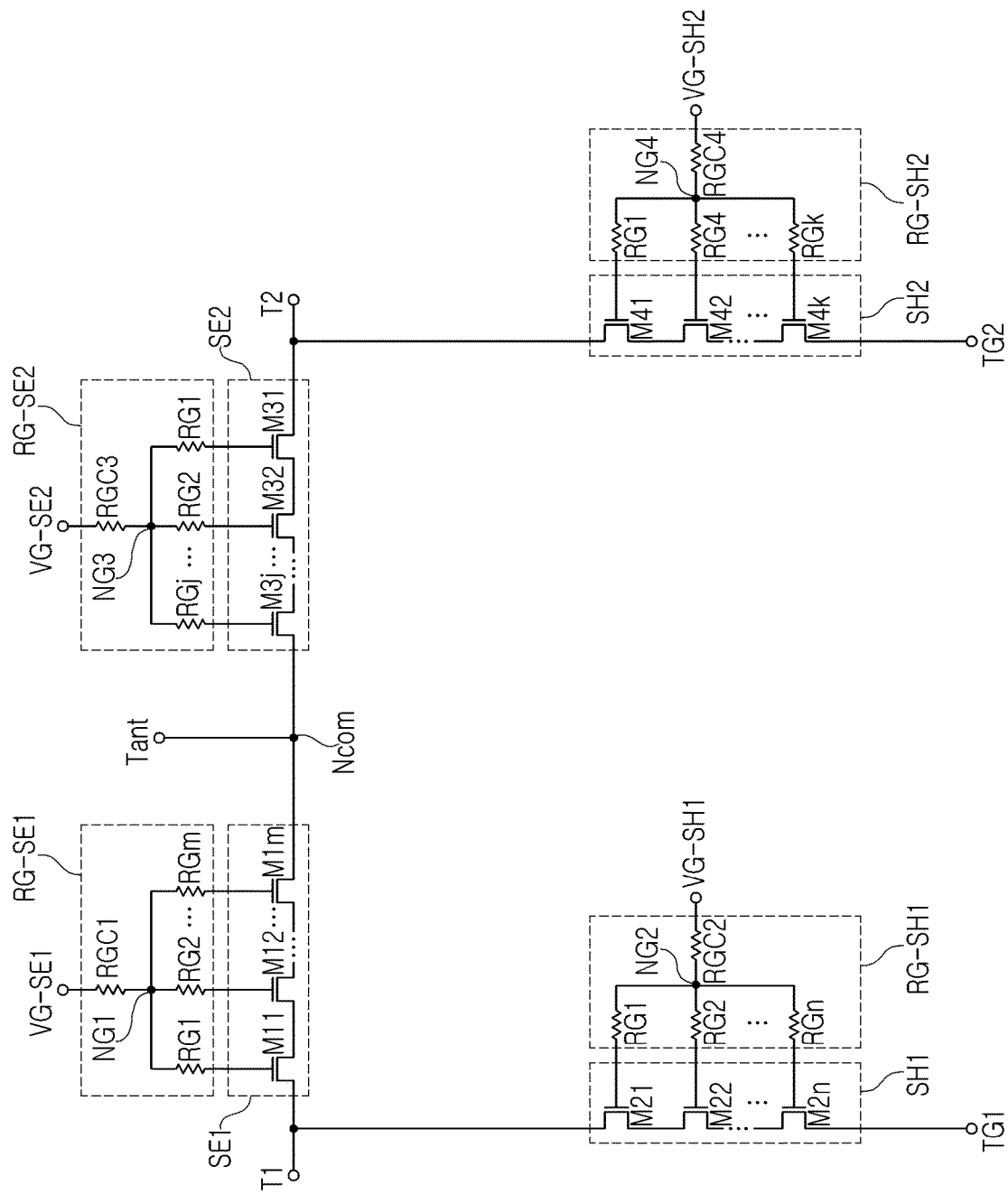
FIG. 7 is a circuit diagram of an example of an SPDT radio-frequency switch including individual gate resistors and common gate resistors.
Figure 8:
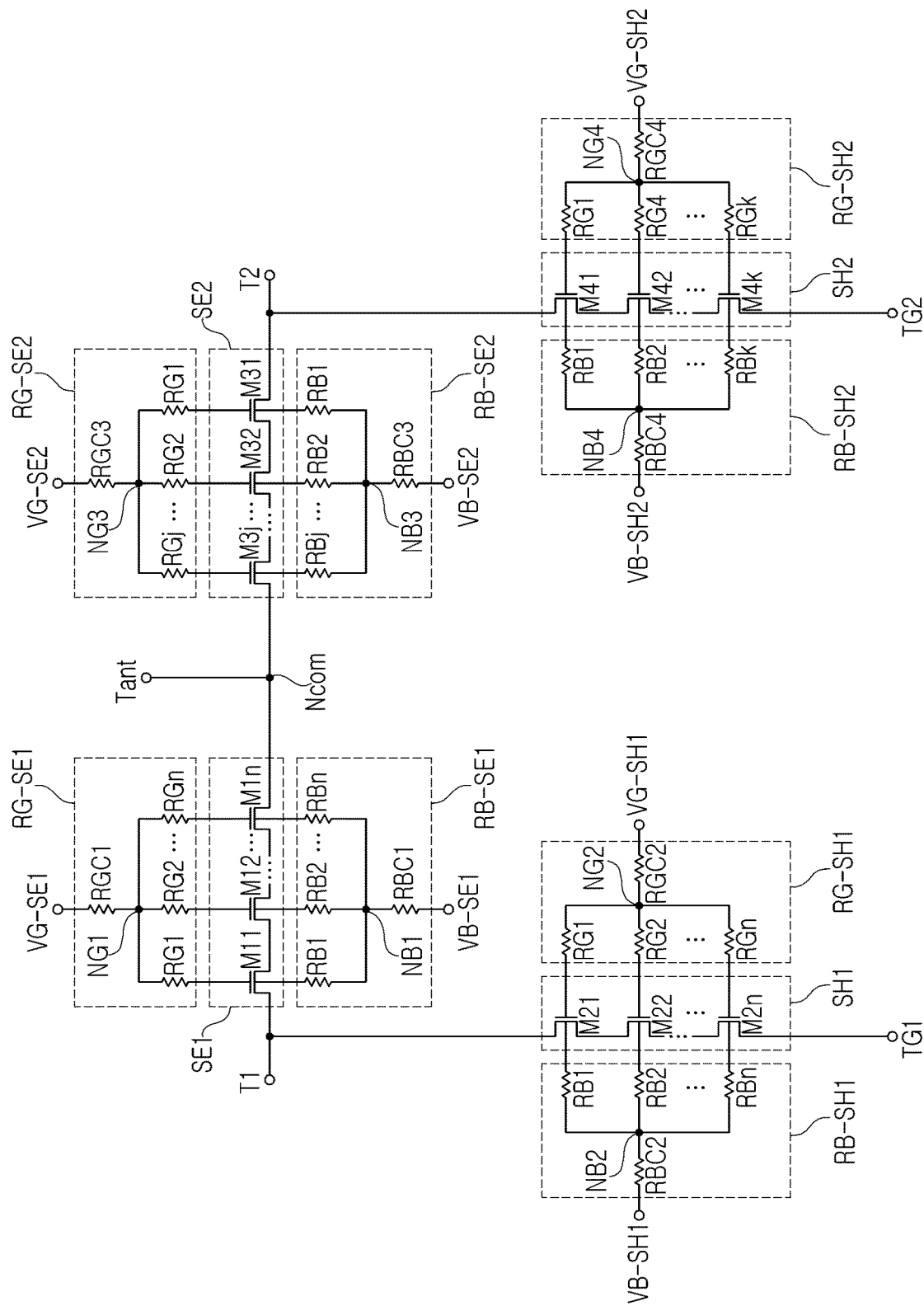
FIG. 8 is a circuit diagram of an example of an SPDT radio-frequency switch including individual gate resistors, individual body resistors, common gate resistors, and common body resistors.

FIG. 7 is a circuit diagram of an example of an SPDT radio-frequency switch including individual gate resistors and common gate resistors, and FIG. 8 is a circuit diagram of an example of an SPDT radio-frequency switch including individual gate resistors, individual body resistors, common gate resistors, and common body resistors.

Referring to FIG. 7, an SPDT radio-frequency switch has the circuit structure of FIG. 5, except that the plurality of series FETs M11 to M1$m$ of the first series switch SE1 are connected in series between the first terminal T1 and a common node Ncom, and further includes a second series switch SE2, a second shunt switch SH2, a second series gate resistor circuit RG-SE2, and a second shunt gate resistor circuit RG-SH2. A terminal Tant is connected to the common mode Ncom, and may be connected to an antenna of a smartphone or other mobile device having a wireless communication capability. The first series switch SE1 and the second shunt switch SH2 are turned on and off at the same time, and the first shunt switch SH1 and the second series switch SE2 are turned on and off at the same time. When the first series switch SE1 and the second shunt switch SH2 are turned on, the first shunt switch SH1 and the second series switch SE2 are turned off. When the first series switch SE1 and the second shunt switch SH2 are turned off, the first shunt switch SH1 and the second series switch SE2 are turned on.

The second series switch SE2 includes a plurality of series FETs M31 to M3$j$ (where j is a natural number of 2 or more) connected in series between the second terminal T2 and the common node Ncom. Thus, j is a total number of the series FETs stacked in the second series switch SE2, i.e., a total number of the stacked series FETs in the second series switch SE2.

The second shunt switch SH2 includes a plurality of shunt FETs M41 to M4$k$ (where k is a natural number of 2 or more) connected in series between the second terminal T2 and a second ground terminal TG2. Thus, k is a total number of the shunt FETs stacked in the second shunt switch SH2, i.e., a total number of the stacked shunt FETs in the second shunt switch SH2.

The second series gate resistor circuit RG-SE2 includes a plurality of gate resistors RG1 to RGj respectively connected between gates of the plurality of series FETs M31 to M3j of the second series switch SE2 and a common connection node NG3 of the plurality of gate resistors RG1 to RGj, and a common gate resistor RGC3 connected between the common connection node NG3 and a second series gate voltage terminal VG-SE2.

The second shunt gate resistor circuit RG-SH2 includes a plurality of gate resistors RG1 to RGk respectively connected between gates of the plurality of shunt FETs M41 to M4k of the second shunt switch SH2 and a common connection node NG4 of the plurality of gate resistors RG1 to RGk, and a common gate resistor RGC4 connected between the common connection node NG4 and a second shunt gate voltage terminal VG-SH2.

Referring to FIG. 8, an SPDT radio-frequency switch has the circuit structure of FIG. 6, and further includes a second series body resistor circuit RB-SE2 and a second shunt body resistor circuit RB-SH2.

The second series body resistor circuit RB-SE2 includes a plurality of body resistors RB1 to RBj respectively connected between bodies of the plurality of series FETs M31 to M3j of the second series switch SE2 and a common connection node NB3 of the plurality of body resistors RB1 to RBj, and a common body resistor RBC3 connected between the common connection node NB3 and a second series body voltage terminal VB-SE2.

The second shunt body resistor circuit RB-SH2 includes a plurality of body resistors RB1 to RBk connected between bodies of the plurality of shunt FETs M41 to M4k of the second shunt switch SH2 and a common connection node NB4 of the plurality of body resistors RB1 to RBk, and a common body resistor RBC4 connected between the common connection node NB4 and a second shunt body voltage terminal VB-SH2.

Referring to FIGS. 7 and 8, when a total number of the plurality of gate resistors RG1 to RGk of the second shunt gate resistor circuit RG-SH2 is an odd number, a position of a gate resistor located at a center of the plurality of gate resistors RG1 to RGk, i.e., a position of a center gate resistor of the plurality of gate resistors RG1 to RGk, is designated as a third reference position. Conversely, when the total number of the plurality of gate resistors RG1 to RGk is an even number, a center point located at the center of the plurality of gate resistors RG1 to RGk is designated as the third reference position. In either case, a total number of gate resistors located on a second terminal T2 side of the third reference position among the plurality of gate resistors RG1 to RGk is equal to a total number of gate resistors located on a second ground terminal TG2 side of the third reference position among the plurality of gate resistors RG1 to RGk. Respective resistance values of the gate resistors located on the second terminal T2 side of the third reference position successively increase in a direction away from the third reference position toward the second terminal T2, and respective resistance values of the gate resistors located on the second ground terminal TG2 side of the third reference position successively increase in a direction away from the third reference position toward the second ground terminal TG2.

Referring to FIG. 8, when a total number of the plurality of body resistors RB1 to RBk of the second shunt body resistor circuit RB-SH2 is an odd number, a body resistor located at a center of the plurality of body resistors RB1 to RBk, i.e., a position of a center body resistor of the plurality of body resistors RB1 to RBk, is designated as a fourth reference position, and when the total number of the plurality of body resistors RB1 to RBk is an even number, a center point located at the center of the plurality of body resistors RB1 to RBk is designated as the fourth reference position. In either case, a total number of body resistors located on a second terminal T2 side of the fourth reference position among the plurality of body resistors RB1 to RBk is equal to a total number of body resistors located on a second ground terminal TG2 side of the fourth reference position among the plurality of body resistors RB1 to RBk. Respective resistance values of the body resistors located on the second terminal T2 side of the fourth reference position successively increase in a direction away from the fourth reference position toward the second terminal T2, and respective resistance values of the body resistors located on the second ground terminal TG2 side of the fourth reference position successively increase in a direction away from the fourth reference position toward the second ground terminal TG2.

Referring to FIGS. 5 to 8, among the plurality of gate resistors RG1 to RGn of the first shunt gate resistor circuit RG-SH1, each of the gate resistors located on the first terminal T1 side of the first reference position and each of the gate resistors located on the first ground terminal TG1 side of the first reference position has a resistance value determined by Equation 6 below.

$RG1'$ $$RGm' = PV'^* RG(m'-1) \tag{6}$$

In Equation 6, m' denotes a position number of an m'-th shunt FET among the plurality of shunt FETs M21 to M2n of the first shunt switch SH1 sequentially counted beginning with 1 from the shunt FET M21 closest to the first terminal T1 toward the first reference position, and also sequentially counted beginning with 1 from the shunt FET M2n closest to the first ground terminal TG1 toward the first reference position, where RGm' is evaluated for m'≥2. For example, m'=1 is the position number of the shunt FET M21 closest to the first terminal T1, and is also the position number of the shunt FET M2n closest to the first ground terminal TG1. m' is symmetrical with respect to the first reference position. For example, m'=1, 2, 3, . . . sequentially counting from the first terminal T1 toward the first reference position, and also sequentially counting from the first ground terminal TG1 toward the first reference position. PV' is less than 1, and successively decreases as m' increases. PV' is not an abbreviation of anything. RG1' denotes the resistance value of the gate resistor RG1 connected to the gate of the shunt FET M21 closest to the first terminal T1 among the plurality of gate resistors RG1 to RGn of the first shunt gate resistor circuit RG-SH1, and also denotes the resistance value of the gate resistor RGn connected to the gate of the shunt FET M2n closest to the first ground terminal TG1 among the plurality of gate resistors RG1 to RGn of the first shunt gate resistor circuit RG-SH1. RGm' denotes the resistance value of a gate resistor connected to the gate of the m'-th shunt FET located on the first terminal T1 side of the first reference position among the plurality of gate resistors RG1 to RGn of the first shunt gate resistor circuit RG-SH1, and also denotes the resistance value of a gate resistor connected to the gate of the m'-th shunt FET located on the first ground terminal TG1 side of the first reference position among the plurality of gate resistors RG1 to RGn of the first shunt gate resistor circuit RG-SH1.

More specifically, among the plurality of gate resistors RG1 to RGn of the first shunt gate resistor circuit RG-SH1, each of the gate resistors located on the first terminal T1 side of the first reference position and each of the gate resistors located on the first ground terminal TG1 side of the first reference position has a resistance value determined by Equation 7 below.

RG1'

$$RGm'=\{(2n'-2m'+1)/(2n'-2m'+3)\}*RG(m'-1) \qquad (7)$$

In Equation 7, n' denotes a total number of shunt FETs located on the first terminal T1 side of the first reference position among the shunt FETs M21 to M2n of the first shunt switch SH1, that is, a total number of stacked shunt FETs located on the first terminal T1 side of the first reference position, and also denotes a total number of shunt FETs located on the first ground terminal TG1 side of the first reference position among the shunt FETs M21 to M2n of the first shunt switch SH1, that is, a total number of stacked shunt FETs located on the first ground terminal T1 side of the first reference position, where n'≥2. m' denotes a position number of an m'-th shunt FET among the n' shunt FETs located on the first terminal T1 side of the first reference position sequentially counted beginning with 1 from the shunt FET M21 closest to the first terminal T1 toward the first reference position, and also denotes a position number of an m'-th shunt FET among the n' shunt FETs located on the first ground terminal TG1 side of the first reference position sequentially counted beginning with 1 from the shunt FET M2n closest to the first ground terminal TG1 toward the first reference position, where RGm' is evaluated for 2≤m'≤n'. RG1' denotes the resistance value of the gate resistor RG1 connected to the gate of the shunt FET M21 closest to the first terminal T1 among the plurality of gate resistors RG1 to RGn of the first shunt gate resistor circuit RG-SH1, and also denotes the resistance value of the gate resistor RGn connected to the gate of the shunt FET M2n closest to the first ground terminal TG1 among the plurality of gate resistors RG1 to RGn of the first shunt gate resistor circuit RG-SH1. RGm' denotes the resistance value of a gate resistor connected to the gate of the m'-th shunt FET located on the first terminal T1 side of the first reference position among the plurality of gate resistors RG1 to RGn of the first shunt gate resistor circuit RG-SH1, and also denotes the resistance value of a gate resistor connected to the gate of the m'-th shunt FET located on the first ground terminal TG1 side of the first reference position among the plurality of gate resistors RG1 to RGn of the first shunt gate resistor circuit RG-SH1. $\{(2n-2m'+1)/(2n-2m'+3)\}$ corresponds to PV' in Equation 6. Thus, PV' is a function of m' and n'.

Equations 6 and 7 above that are applicable to the plurality of gate resistors RG1 to RGn of the first shunt gate resistor circuit RG-SH1 in FIGS. 5 to 8 are also applicable to the plurality of gate resistors RG1 to RGk of the second shunt gate resistor circuit RG-SH2 in FIGS. 7 and 8.

Furthermore, referring to FIGS. 6 and 8, among the plurality of body resistors RB1 to RBn of the first shunt body resistor circuit RB-SH1, each of a the body resistors located on the first terminal T1 side of the second reference position and each of the body resistors located on the first ground terminal TG1 side of the second reference position has a resistance value determined by Equation 8 below.

RB1'

$$RBm'=PV'*RB(m'-1) \qquad (8)$$

In Equation 8, m' denotes a position number of an m'-th shunt FET among the plurality of shunt FETs M21 to M2n of the first shunt switch SH1 sequentially counted beginning with 1 from the shunt FET M2n closest to the first terminal T1 toward the second reference position, and also sequentially counted beginning with 1 from the first ground terminal TG1 toward the second reference position, where RBm' is evaluated for m'≥2. For example, m'=1 is the position number of the shunt FET M21 closest to the first terminal T1, and is also the position number of the shunt FET M2n closest to the first ground terminal TG1. m' is symmetrical with respect to the second reference position. For example, m'=1, 2, 3, . . . sequentially counting from the first terminal T1 toward the second reference position, and also sequentially counting from the first ground terminal TG1 toward the second reference position. PV' is less than 1, and successively decreases as m' increases. PV' is not an abbreviation of anything. RB1' denotes the resistance value of the body resistor RB1 connected to the body of the shunt FET M21 closest to the first terminal T1 among the plurality of body resistors RB1 to RBn of the first shunt body resistor circuit RB-SH1, and also denotes the resistance value of the body resistor RBn connected to the body of the shunt FET M2n closest to the first ground terminal TG1 among the plurality of body resistors RB1 to RBn of the first shunt body resistor circuit RB-SH1. RBm' denotes the resistance value of a body resistor connected to the body of the m'-th shunt FET located on the first terminal T1 side of the second reference position among the plurality of body resistors RB1 to RBn of the first shunt body resistor circuit RB-SH1, and also denotes the resistance value of a body resistor connected to the body of the m'-th shunt FET located on the first ground terminal TG1 side of the second reference position among the plurality of body resistors RB1 to RBn of the first shunt body resistor circuit RB-SH1.

More specifically, among the plurality of gate resistors RB1 to RBn of the first shunt body resistor circuit RB-SH1, each of the body resistors located on the first terminal T1 side of the second reference position and each of the body resistors located on the first ground terminal TG1 side of the second reference position has a resistance value determined by Equation 9 below.

RB1'

$$RBm'=\{(2n'-2m'+1)/(2n'-2m'+3)\}*RB(m'-1) \qquad (9)$$

In Equation 9, n' denotes a total number of shunt FETs located on the first terminal T1 side of the second reference position among the shunt FETs M21 to M2n of the first shunt switch SH1, that is, a total number of stacked shunt FETs located on the first terminal T1 side of the second reference position, and also denotes a total number of shunt FETs located on the first ground terminal TG1 side of the second reference position among the shunt FETs M21 to M2n of the first shunt switch SH1, that is, a total number of stacked shunt FETs located on the first ground terminal T1 side of the second reference position, where n'≥2. m' denotes a position number of an m'-th shunt FET among the n' shunt FETs located on the first terminal T1 side of the second reference position sequentially counted beginning with 1 from the shunt FET M21 closest to the first terminal T1 toward the second reference position, and also denotes a position number of an m'-th shunt FET among the n' shunt FETs located on the first ground terminal TG1 side of the second reference position sequentially counted beginning with 1 from the shunt FET M2n closest to the first ground terminal TG1 toward the second reference position, where RBm' is evaluated for 2≤m'≤n'. RB1' denotes the resistance value of the body resistor RB1 connected to the body of the shunt FET M21 closest to the first terminal T1 among the plurality of body resistors RB1 to RBn of the first shunt body resistor circuit RB-SH1, and also denotes the resistance value of the body resistor RBn connected to the body of the shunt FET M2n closest to the first ground terminal TG1 among the plurality of body resistors RB1 to RBn of the first shunt body resistor circuit RB-SH1. RBm' denotes the resistance value of a body resistor connected to the body of the m'-th shunt FET located on the first terminal T1 side of the second reference position among the plurality of body resistors RB1 to RBn of the first shunt body resistor circuit RB-SH1, and also denotes the resistance value of a body resistor connected to the body of the m'-th shunt FET located on the first ground terminal TG1 side of the second reference position among the plurality of body resistors RB1 to RBn of the first shunt body resistor circuit RB-SH1. {(2n−2m'+1)/(2n−2m'+3)} corresponds to PV' in Equation 8. Thus, PV' is a function of m' and n'.

Equations 8 and 9 above that are applicable to the plurality of body resistors RB1 to RBn of the first shunt body resistor circuit RB-SH1 in FIGS. 6 and 8 are also applicable to the plurality of body resistors RB1 to RBk of the second shunt body resistor circuit RB-SH2 in FIG. 8.

Figure 9:
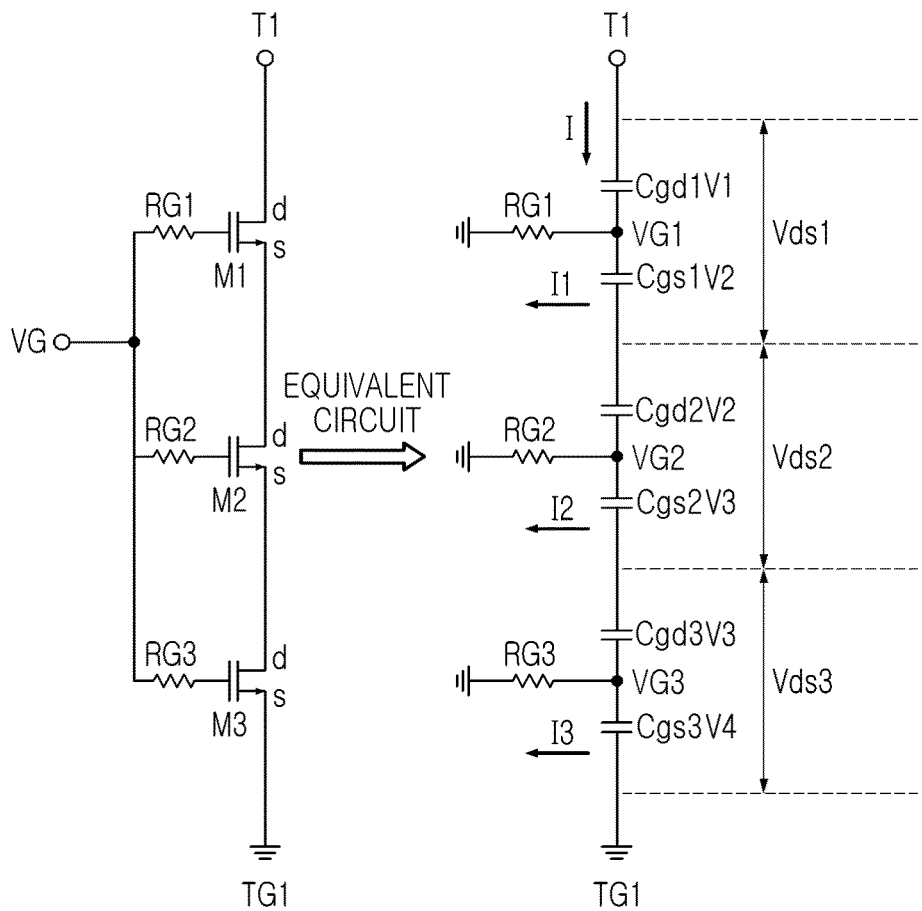
FIG. 9 is a circuit diagram of an example of a switch and an equivalent circuit diagram of the switch in an OFF state.

FIG. 9 is a circuit diagram of an example of a switch and an equivalent circuit diagram of the switch in an OFF state.

Referring to FIG. 9, a correlation between a leakage current through a gate resistor and a resistance value of the gate resistor will be examined.

The left side of FIG. 9 is a circuit diagram of a switch including FETs M1, M2, and M3 connected in series between a first terminal T1 and a first ground terminal TG1, and gate resistors RG1, RG2, and RG3 respectively connected between gates of the FETs M1, M2, and M3 and a gate voltage terminal VG. The right side of FIG. 9 is an equivalent circuit diagram of the switch on the left side of FIG. 9 in an OFF state.

A gate voltage applied to the gate voltage terminal VG is 0 V or less in an OFF state. When the switch on the left side of FIG. 9 is used to switch an RF signal having a frequency of several hundreds of MHz or more, the switch may be represented in the OFF state by the equivalent circuit on the right side of FIG. 9.

In a radio-frequency switch having a series-shunt structure including a first series switch SE1 and a first shunt switch SH1, like the example illustrated in FIG. 1, the switch of FIG. 9 may be used as the first series switch SE1 and the first shunt switch SH1. When the first series switch SE1 is turned on, the first shunt switch SH1 is turned off, and may be represented by the equivalent circuit diagram in FIG. 9. When the first shunt switch SH1 is turned on, the first series switch SE1 is turned off, and may be represented by the equivalent circuit diagram in FIG. 9.

In a radio-frequency single-pole double-throw (SPDT) switch having a series-shunt structure including a first series switch SE1, a first shunt switch SH1, a second series switch SE2, and a second shunt switch SH2, like the example illustrated in FIG. 3, the switch of FIG. 9 may be used as the first series switch SE1, the first shunt switch SH1, the second series switch SE2, and the second shunt switch SH2. The first series switch SE1 and the second shunt switch SH2 are turned on and off at the same time, and the first shunt switch SH1 and the second series switch SE2 are turned on and off at the same time. When the first series switch SE1 and the second shunt switch SH2 are turned on, the first shunt switch SH1 and the second series switch SE2 are turned off, and may be represented by the equivalent circuit diagram in FIG. 9. When the first shunt switch SH1 and the second series switch SE2 are turned on, the first series switch SE1 and the second shunt switch SH2 are turned off, and may be represented by the equivalent circuit diagram in FIG. 9.

When each FET in FIG. 9 is in the OFF state, a drain-source resistance Rds of the FET, i.e., a resistance value of a channel of the FET, is very high, and thus has been omitted in the equivalent circuit. The capacitors in the equivalent circuit represent a gate-source capacitance Cgs and a gate-drain capacitance Cgd of each FET.

Even if each FET is symmetrically fabricated in an attempt to make the gate-source capacitance Cgs and the gate-drain capacitance Cgd have the same value, the gate-source capacitance Cgs and the gate-drain capacitance Cgd may have different values depending on a process variation and an applied voltage. However, if the influence of the leakage current is small, the voltages applied to the gate-source capacitance Cgs and the gate-drain capacitance Cgd may be assumed to have the same value.

When an RF signal is applied to the first terminal T1, a current I flows into the first terminal T1. The current I depends on a voltage of the RF signal and an equivalent impedance of the switch when viewed in a direction from the first terminal T1 to the first ground terminal TG1. The equivalent impedance of the switch in the OFF state has a very high value, so the current I has a very low value of several µA to several tens of µA, and the direction of the voltage and the direction of the current I change according to a phase of the RF signal. When stacking FETs, a designer wants a voltage applied across the stacked FETs to be uniformly distributed to the FETs so that a drain-source voltage Vds applied across each of the FETs will be the same. Since every FET has a maximum drain-source voltage Vds that the FET can withstand, if the same drain-source voltage Vds is applied across each of the FETs, a number of FETs needed to fabricate a switch may be significantly reduced.

If respective resistance values of the gate resistors RG1, RG2, and RG3 are set high enough that leakage currents I1, I2, and I3 respectively flowing to ground through the gate resistors RG1, RG2, and RG3 and the gate voltage terminal VG may be ignored, a current flowing through each of the gate-source capacitances Cgs and the gate-drain capacitances Cgd may be assumed to be 1. In this case, in the equivalent circuit on the right side of FIG. 9, when Cgd1=Cgs1=Cgd2=Cgs2=Cgd3=Cgs3, then Vds1=Vds2=Vds3, so the same drain-source voltage Vds is applied across each of the FETs M1, M2, and M3.

When the gate of each FET is viewed from the gate voltage terminal VG to which the gate voltage is applied, the resistance value of the gate resistor RG connected to the gate of the FET and a gate capacitance CG=Cgs+Cgd of the FET determines a switching turn-on/turn-off time of the FET. However, if the resistance value of the gate resistor RG is increased to be high enough so that the gate leakage current can be ignored, the switching turn-on/turn-off time also increases.

For this reason, the gate resistor RG is usually designed to have as high a resistance value as possible within a range allowed by a desired switching time. However, this may result in the resistance value of the gate resistor being too low to ignore the gate leakage current. In this case, respective voltages across the gate-source capacitance Cgs and the gate-drain capacitance Cgd of each FET may be represented by Equation 10 below.

$$V1 = I^* (1/(2\pi f Cdg1))$$

$$V2 = (I-I1)^* (1/(2\pi f Cgs1)) = (I-I1)^* (1/(2\pi f Cgd2))$$

$$V3=(I-I1-I2)*(1/(2\pi fCgs2))=(I-I1-I2)*(1/(2\pi fCgd3))$$

$$V4=(I-I1-I2-I3)*(1/(2\pi fCgs3)) \quad (10)$$

There is no leakage path between Cgs1 of the FET M1 and Cgd2 of the FET M2, so the same voltage V2 is applied across Cgs1 and Cgd2 (assuming that Cgs1=Cgd2). Also, there is no leakage path between Cgs2 of the FET M2 and Cgd3 of the FET M3, so the same voltage V3 is applied across Cgs2 and Cgd3 (assuming that Cgs2=Cgd3).

Therefore, assuming that Cgd1=Cgs1=Cgd2=Cgs2=Cgd3=Cgs3=C, and Zc=1/(2πfC), where Zc is an impedance of the capacitance C, the drain-source voltage Vds applied to each FET may be represented by Equation 11 below.

$$Vds1=V1+V2=(2*I-I1)*Zc$$

$$Vds2=V2+V3=(2*I-2*I1-I2)*Zc$$

$$Vds3=V3+V4=(2*I-2*I1-2*I2-I3)*Zc \quad (11)$$

In addition to the switching time, a gate leakage current affects other characteristics such as harmonic performance, and thus should be significantly reduced. The gate leakage current of each FET is determined by the gate voltage and the resistance value of the gate resistor of each FET. FIG. 9 shows gate voltages VG1, VG2, and VG3 of the FETs M1, M2, and M3. For comparison of performance, an example in which a sum of the gate leakage currents I1, I2, and I3 of the FETs M1, M2, and M3 is a constant is described below.

Assuming that I1+I2+I3=A, where A is a constant, voltage differences between the drain-source voltages of the FETs may be represented by Equation 12 below.

$$\Delta Vds1=Vds1-Vds2=(I1+I2)*Zc$$

$$\Delta Vds2=Vds2-Vds3=(I2+I3)*Zc \quad (12)$$

Referring to Equation 12, when I1=I2=I3, the voltage differences ΔVds between the drain-source voltages Vds of the FETs are equal to zero. However, when the gate resistors RG1, RG2, and RG3 have the same resistance value, I1>I2>I3 because, as can be seen from FIG. 9, VG1>VG2>VG3, so that the voltage differences ΔVds between the drain-source voltages Vds of the FETs are not equal to zero. Conversely, it can be seen that when the gate resistors RG1, RG2, and RG3 have appropriate different resistance values so that I1=I2=I3, the voltage differences ΔVds between the drain-source voltages Vds of the FETs will be equal to zero.

Therefore, how to set the resistance values of the gate resistors so that the leakage currents of the gate resistors are equal to each other will be described below.

When a peak voltage of an RF signal applied to the first terminal T1 is Vpk and n FETs are stacked, where n≥2, a gate voltage VG of each FET is represented by Equation 13 below.

$$VG1 = Vpk - Vpk/2n \quad (13)$$

$$VG2 = Vpk - Vpk/2n - 2*Vpk/2n = Vpk - 3*Vpk/2n$$

$$VG3 = Vpk - 5*Vpk/2n$$

$$...$$

$$VGm = Vpk - (2m-1)*Vpk/2n$$

VGm is evaluated for 2≤m≤n. VG2 and VG3 are already listed in Equation 13.

Therefore, the gate leakage current of each FET is expressed by Equation 14 below.

$$I1 = VG1/RG1 = (Vpk - Vpk/2n)/RG1 \quad (14)$$

$$I2 = VG2/RG2 = (Vpk - 3*Vpk/2n)/RG2$$

$$I3 = VG3/RG3 = (Vpk - 5*Vpk/2n)/RG3$$

$$...$$

$$Im = VGm/RGm = (Vpk - (2m-1)*Vpk/2n)/RGm$$

Im is evaluated for 2≤m≤n. I2 and I3 are already listed in Equation 14.

Based on Equation 14, to obtain I1=I2=I3= . . . In, each gate resistor RG has a resistance value determined by Equation 15 below.

$$RG1 \quad (15)$$

$$RG2 = \{(2n-3)/(2n-1)\}*RG1$$

$$RG3 = \{(2n-5)/(2n-3)\}*RG2$$

$$...$$

$$RGm = \{(2n-2m+1)/(2n-2m+3)\}*RG(m-1)$$

Equation 15 is the same as Equation 2 above. In Equation 15, n is a total number of shunt FETs stacked (i.e., connected in series) between the first terminal T1 and the first ground terminal TG1, where n≥2. m denotes a position number of an m-th shunt FET among the n shunt FETs, sequentially counted beginning with 1 from the shunt FET closest to the first terminal T1, where RGm is evaluated for 2≤m≤n. RG2 and RG3 are already listed in Equation 15. RG1 denotes the resistance value of the gate resistor connected to the gate of the shunt FET closest to the first terminal T1. RGm denotes the resistance value of a gate resistor connected to the gate of the m-th shunt FET.

According to Equation 15, for n=5, that is, the number of stacked shunt FETs is 5, and RG1=1000 kΩ, RG1=1000 kΩ, RG2=(7/9)*1000 kΩ=778 kΩ, RG3=(5/7)*778 kΩ=556 kΩ, RG4=(3/5)*556 kΩ=333 kΩ, and RG5=(1/3)*333 kΩ=111 kΩ.

Figure 10:
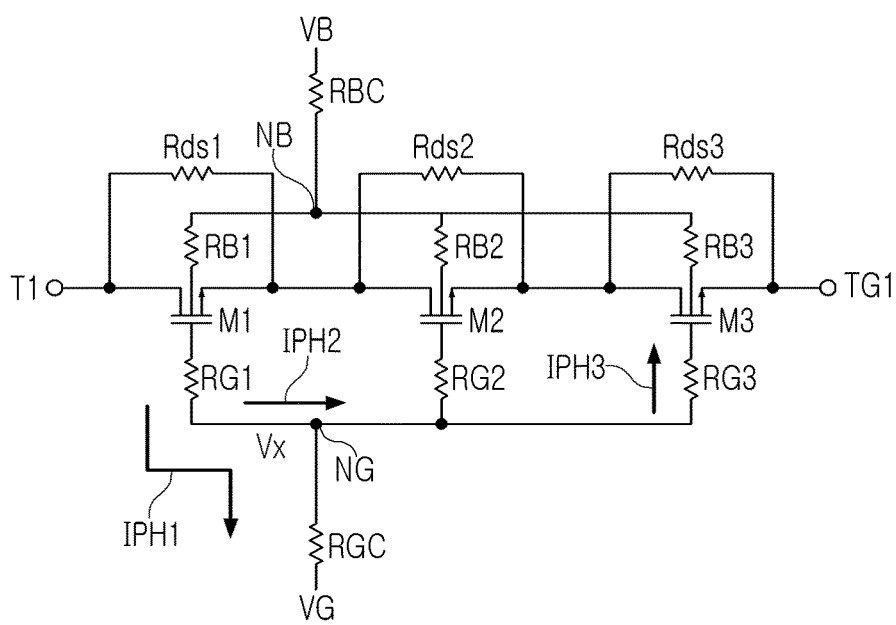
FIG. 10 is a circuit diagram of an example of a shunt switch including individual gate resistors, individual body resistors, a common gate resistor, and a common body resistor.

FIG. 10 is a circuit diagram of an example of a shunt switch including individual gate resistors, individual body resistors, a common gate resistor, and a common body resistor.

Referring to FIG. 10, a shunt switch includes first, second, and third shunt FETs M1, M2, and M3 connected in series between a first terminal T1 and a first ground terminal TG1, individual gate resistors RG1, RG2, and RG3 respectively connected between gates of the first, second, and third shunt FETs M1, M2, and M3 and a common connection node NG of the individual gate resistors RG1, RG2, and RG3, and individual body resistors RB1, RB2, and RB3 respectively connected between bodies of the first, second, and third shunt FETs M1, M2, and M3 and a common connection node NB of the individual body resistors RB1, RB2, and RB3.

The shunt switch further includes a common gate resistor RGC connected between the common connection node NG of the individual gate resistors RG1, RG2, and RG3 and a gate voltage terminal VG, and a common body resistor RBC connected between the common connection node NB of the individual body resistors RB1, RB2, and RB3 and a body voltage terminal VB.

The shunt switch further includes drain-source resistors Rds1, Rds2, and Rds3 connected between a drain and a source of respective ones of the first, second, and third shunt FETs M1, M2, and M3.

When the respective resistance values of the individual gate resistors RG1, RG2, and RG3 and the common gate resistor RGC are appropriately set in accordance with Equations 13, 14, and 15 described above so that the leakage currents flowing through the individual gate resistors RG1, RG2, and RG3 are equal to each other, the voltage differences ΔVds between the drain-source voltages Vds of the first, second, and third shunt FETs M1, M2, and M3 when the first, second, and third shunt FETs M1, M2, and M3 are turned off are reduced.

For example, when a signal is input to the first terminal T1, a ground voltage is applied to the first ground terminal TG1, and the ground voltage is applied to the gate voltage terminal VG to turn off the first, second, and third shunt FETs M1, M2, and M3, a voltage Vx is generated at the common connection node NG of the individual gate resistors RG1, RG2, and RG3 by a leakage current flowing through the common gate resistor RGC and the gate voltage terminal VG to ground. The voltage Vx is lower than a gate voltage VG1 of the first shunt FET M1 and higher than a gate voltage VG3 of the third shunt FET M3. Accordingly, a portion of the leakage current of the first shunt FET M1 flowing through the gate resistor RG1 flows along a path IPH1 through the common gate resistor RGC and the gate voltage terminal VG to ground, producing the voltage Vx across the common gate resistor RGC, and a remaining portion of the leakage current of the first shunt FET M1 is diverted along a path IPH2 to the third shunt FET M3, and flows along a path IPH3 through the gate resistor RG3 of the third shunt FET M3 to ground. In this case, a drain-source voltage Vds1 applied across the first shunt FET M1 and a drain-source voltage Vds3 applied across the third shunt FET M3 are high, and a drain-source voltage Vds2 applied across the second shunt FET M2 is small. The above description is also applicable to the effect of the common body resistor RBC on the leakage currents of the first, second, and third shunt FETs M1, M2, and M3 flowing through the individual body resistors RB1, RB2, and RB3.

Figure 11:
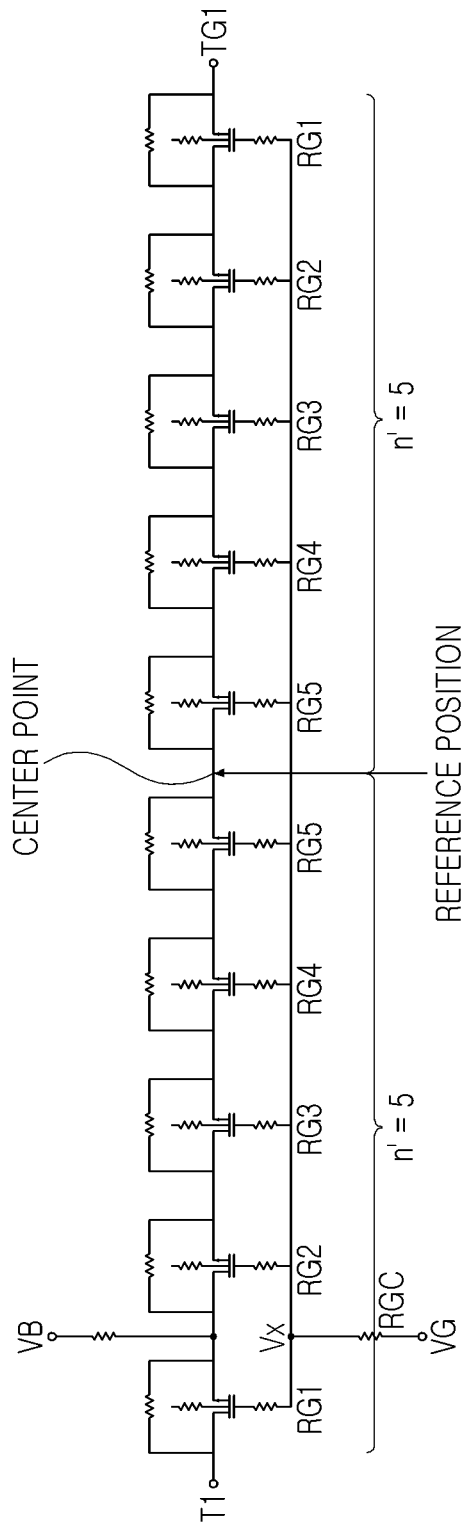
FIG. 11 is a circuit diagram of an example of a first shunt switch including an even number of shunt FETs, individual gate resistors, individual body resistors, a common gate resistor, and a common body resistor.

FIG. 11 is a circuit diagram of an example of a first shunt switch including an even number of shunt FETs, individual gate resistors, individual body resistors, a common gate resistor, and a common body resistor.

FIG. 11 is similar to FIG. 10, except that it includes 10 shunt FETs, so a detailed description of FIG. 11 has been omitted. For convenience of illustration, the individual body resistors are not labeled in FIG. 11, and the common body resistor is omitted from FIG. 11.

Referring to FIG. 11, a total number n of stacked shunt FETs in a shunt switch is an even number, so a center point located at the center of the n stacked shunt FETs is designated as a reference position. Equations 13, 14, and 15 discussed above are applicable to FIG. 11, with Vpk being replaced by Vpk'=Vpk/2, n being replaced by n'=n/2, where n'≥2, and m being replaced by m', where 2≤m'≤n', with m' being sequentially counted beginning with 1 from the shunt FET closest to the first terminal T1 toward the reference position, and also being sequentially counted beginning with 1 from the shunt FET closest to the first ground terminal TG1 toward the reference position.

Resistance values of the individual gate resistors and the individual body resistors are set so that the resistance values of the individual gate resistors and the individual body resistors successively increase in a direction away from the reference position toward the first terminal T1, and also successively increase in a direction away from the reference position toward the first ground terminal TG1, and are symmetrical about the reference position. For example, the gate resistor RG1 on the first terminal T1 side of the reference position and the gate resistor RG1 on the first ground terminal TG1 side of the reference position have the same resistance value, the gate resistor RG2 on the first terminal T1 side of the reference position and the gate resistor RG2 on the first ground terminal TG1 side of the reference position have the same resistance value, and so on.

Figure 12:
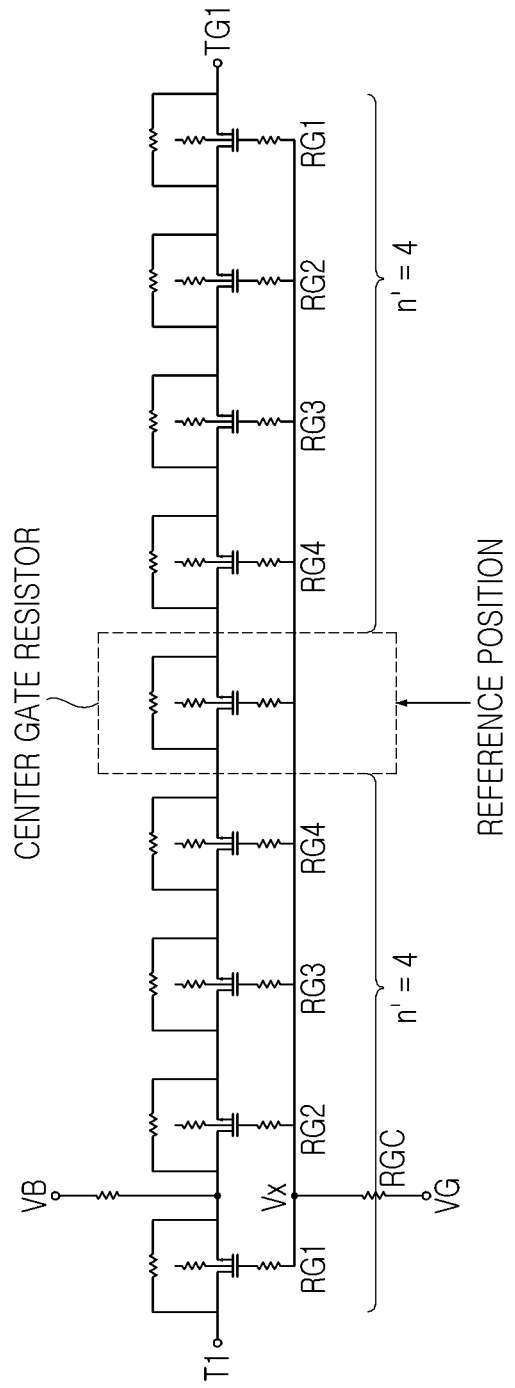
FIG. 12 is a circuit diagram of an example of a first shunt switch including an odd number of shunt FETs, individual gate resistors, individual body resistors, a common gate resistor, and a common body resistor.

FIG. 12 is a circuit diagram of an example of a first shunt switch including an odd number of shunt FETs, individual gate resistors, individual body resistors, a common gate resistor, and a common body resistor.

FIG. 12 is similar to FIG. 10, except that it includes 9 shunt FETs, so a detailed description of FIG. 12 has been omitted. For convenience of illustration, the individual body resistors are not labeled in FIG. 12, and the common body resistor is omitted from FIG. 12.

Referring to FIG. 12, a total number n of stacked FETs in the shunt switch is an odd number, so a shunt FET located at the center of the n stacked shunt FETs is designated as a reference position. Equations 13, 14, and 15 discussed above are applicable to FIG. 12, with Vpk being replaced by Vpk'=Vpk/2, n being replaced by n'=n/2 rounded down to the nearest integer, where n'≥2, and m being replaced by m', where 2≤m'≤n', with m' being sequentially counted beginning with 1 from the shunt FET closest to the first terminal T1 toward the reference position, and also being sequentially counted beginning with 1 from the shunt FET closest to the first ground terminal TG1 toward the reference position.

A resistance value of a center gate resistor of the shunt FET located at the center of the n stacked FETs is set to an arbitrary value. Also, a resistance value of a center body resistor of the shunt FET located at the center of the n stacked FETs is set to an arbitrary value. Resistance values of the individual gate resistors and the individual body resistors are set so that the resistance values of the individual gate resistors and the individual body resistors successively increase in a direction away from the reference position toward the first terminal T1, and also successively increase in a direction away from the reference position toward the first ground terminal TG1, and are symmetrical about the reference position. For example, the gate resistor RG1 on the first terminal T1 side of the reference position and the gate resistor RG1 on the first ground terminal TG1 side of the reference position have the same resistance value, the gate resistor RG2 on the first terminal T1 side of the reference position and the gate resistor RG2 on the first ground terminal TG1 side of the reference position have the same resistance value, and so on.

Figure 13:
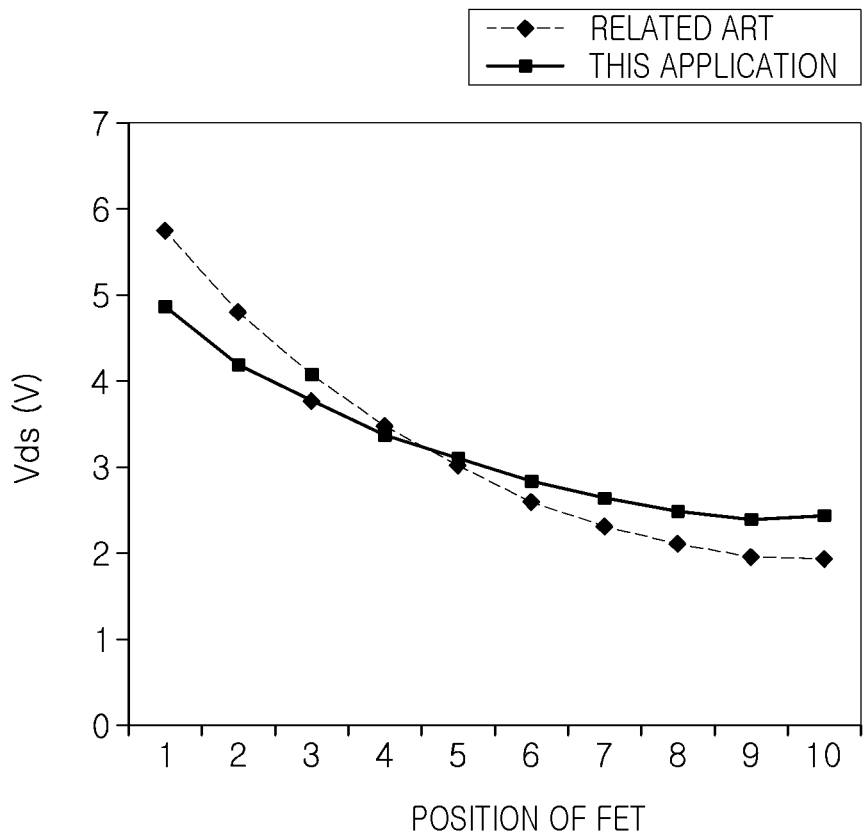
FIG. 13 is a graph an example of a correlation between a position of a shunt FET in a stack of shunt FETs and a drain-source voltage Vds of the shunt FET in a shunt switch including individual gate resistors according to this application and according to the related art.

FIG. 13 is a graph illustrating an example of a correlation between a position of a shunt FET in a stack of shunt FETs and a drain-source voltage Vds of the shunt FET in a shunt switch including individual gate resistors according to this application and according to the related art.

FIG. 13 compares the results of two simulations performed for the shunt switch illustrated in FIG. 9 in the OFF state, with the number of shunt FETs in the stack of shunt FETs being increased from 3 to 10. The X-axis displays the positions of the shunt FETs in the stack of shunt FETs, with "1" denoting the shunt FET closest to the first terminal T1, and "10" denoting the shunt FET closest to the first ground terminal TG1. The Y-axis displays the drain-source voltages Vds of the shunt FETs.

In both simulations, a voltage Vpk set to 36 V was applied to the first terminal T1, and a ground voltage was applied to the first ground terminal TG1 and the gate voltage terminal VG.

In one of the simulations, the resistance values of gate resistors RG1 to RG10 were set to successively decrease in a direction away from the first terminal T1 toward the first ground terminal TG1 as described in this application. In particular, the resistance values of the gate resistors RG1 to RG10 were set to successively decrease from RG1=400 kΩ to RG10=21 kΩ according to Equation 2 above to make the leakage currents of the gate resistors RG1 to RG10 equal to each other. When the number of shunt FETs in the stack of shunt FETs is n=10, RG1/RG10=19, and thus RG10 has a very small value.

In the other simulation, the resistance values of the gate resistors RG1 to RG10 were set to be equal to each other as in the related art.

As can be seen from FIG. 13, the differences between the drain-source voltages Vds of the shunt FETs when the resistances values of the gate resistors RG1 to RG10 are set as described in this application are significantly reduced compared with the differences between the drain-source voltages Vds of the shunt FETs when the resistances values of the gate resistors RG1 to RG10 are set to be equal to each other as in the related art.

Therefore, the resistance values of the gate resistors RG1 to RG10 should be carefully set according to Equation 2 above so that the differences between the leakage currents of the gate resistors RG1 to RG10 having the resistance values described in this application are significantly reduced compared to the differences between the leakage currents of the gate resistors RG1 to RG10 having resistance values that are equal to each other as in the related art as shown in FIG. 13, and so that the sum of the leakage currents of the gate resistors RG1 to RG10 having the resistance values described in this application is equal to the sum of the leakage currents of the gate resistors RG1 to RG10 having resistance values that are equal to each other as in the related art.

Figure 14:
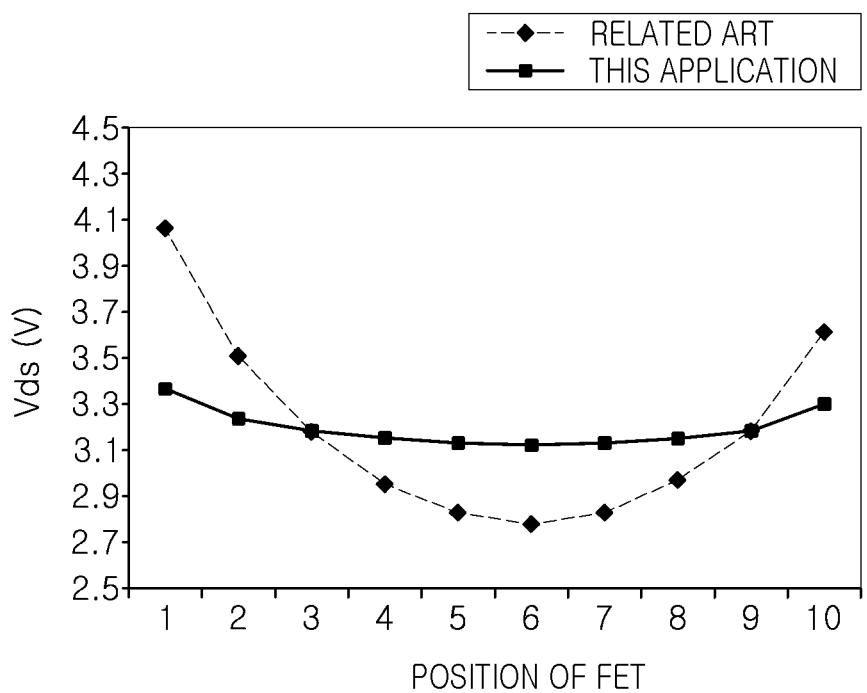
FIG. 14 is a graph an example of a correlation between a position of a shunt FET in a stack of shunt FETs and a drain-source voltage Vds of the shunt FET in a shunt switch including individual gate resistors and a common gate resistor according to this application and according to the related art.

FIG. 14 is a graph illustrating an example of a correlation between a position of a shunt FET in a stack of shunt FETs and a drain-source voltage Vds of the shunt FET in a shunt switch including individual gate resistors and a common gate resistor according to this application and according to the related art.

FIG. 14 compares the results of two simulations performed for the shunt switch illustrated in FIG. 10 in the OFF state, with the number of shunt FETs in the stack of shunt FETs being increased from 3 to 10 as shown in FIG. 11. The X-axis displays the positions of the shunt FETs in the stack of shunt FETs, with "1" denoting the shunt FET closest to the first terminal T1, and "10" denoting the shunt FET closest to the first ground terminal TG1. The Y-axis displays the drain-source voltages Vds of the shunt FETs.

In both simulations, a voltage Vpk set to 36 V was applied to the first terminal T1, and a ground voltage was applied to the first ground terminal TG1 and the gate voltage terminal VG.

In one of the simulations, the resistance values of gate resistors RG1 to RG5 were set to successively decrease in a direction away from the first terminal T1 toward the reference position in FIG. 11 as described in this application, in particular, according to Equation 7 above, and the resistance values of gate resistors RG10 to RG6 (corresponding to RG1 to RG5 in FIG. 11) were set to successively decrease in a direction away from the first ground terminal TG1 toward the reference position in FIG. 11 as described in this application, in particular, according to Equation 7 above.

In the other simulation, the resistance values of the gate resistors RG1 to RG10 were set to be equal to each other as in the related art.

As can be seen from FIG. 14, the differences between the drain-source voltages Vds of the shunt FETs when the resistance values of the gate resistors RG1 to RG10 are as described in this application are significantly reduced compared with the differences between the drain-source voltages Vds of the shunt FETs when the resistance values of the gate resistors RG1 to RG10 are set to be equal to each other as in the related art.

Figure 15:
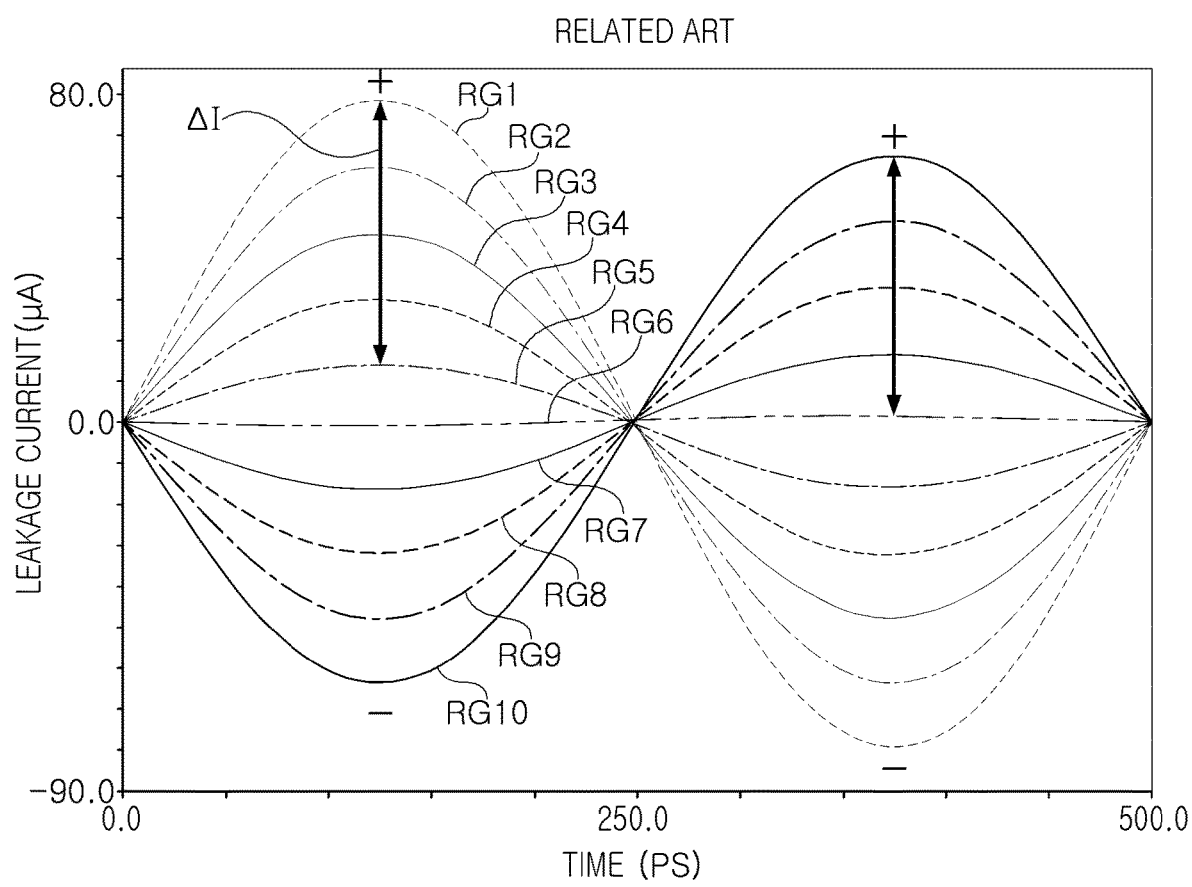
FIG. 15 is a graph of an example of leakage currents of gate resistors connected to gates of shunt FETs stacked in a shunt switch of the related art.
Figure 16:
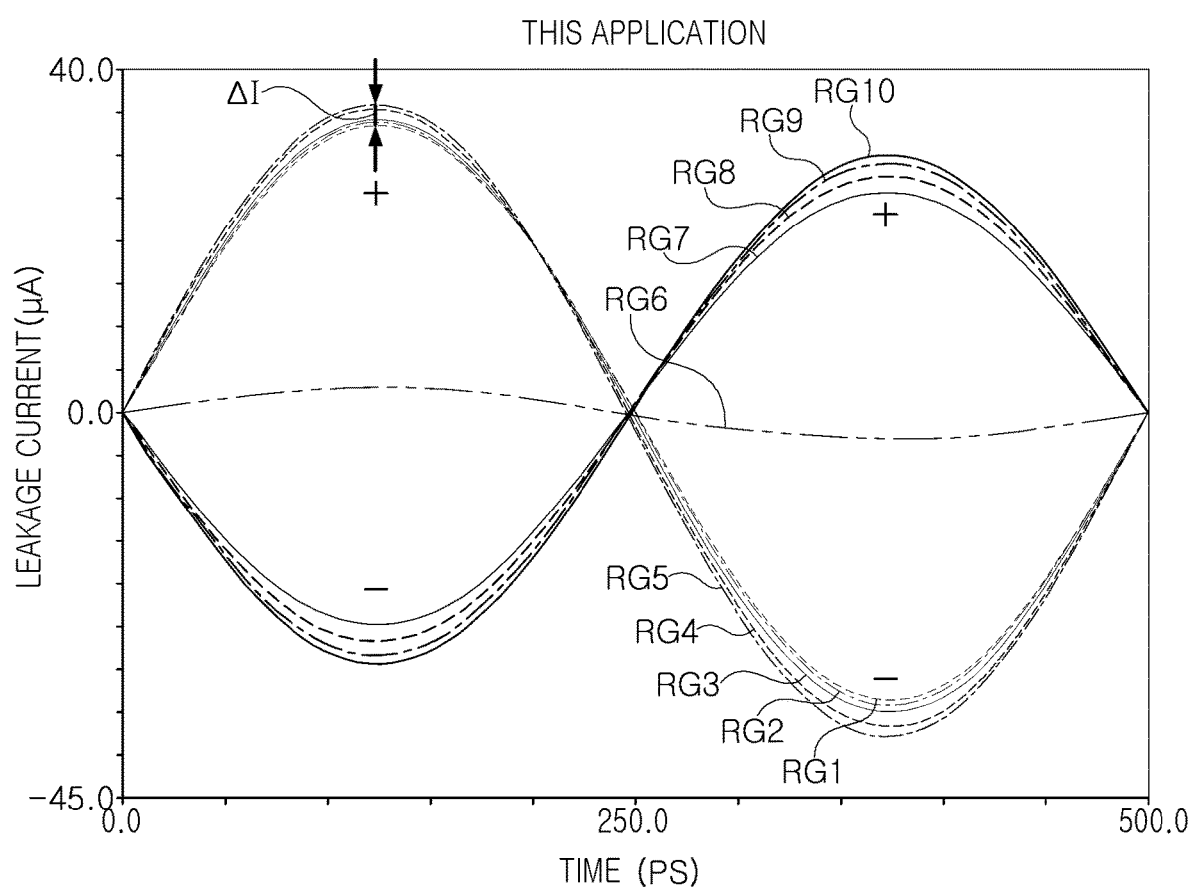
FIG. 16 is a graph of an example of leakage currents of gate resistors connected to gates of shunt FETs stacked in a shunt switch of this application.

FIG. 15 is a graph of an example of leakage currents of gate resistors connected to gates of shunt FETs stacked in a shunt switch of the related art, and FIG. 16 is a graph of an example of leakage currents of gate resistors connected to gates of shunt FETs stacked in a shunt switch of this application.

Graphs RG1 to RG10 illustrated in FIGS. 15 and 16 are graphs of leakage currents measured in μA of 10 shunt FETs stacked in a shunt switch in an OFF state through gate resistors RG1 to RG10 respectively connected to gates of the 10 shunt FETs with respect to time measured in picoseconds (ps) produced by an RF signal having a frequency of 2 GHz applied across the shunt switch. The shunt switch of the related art for which the leakage currents are shown in FIG. 15 is the shunt switch of the related art in which the resistance values of the gate resistors RG1 to RG10 are set to be equal to each other. The shunt switch of this application for which the leakage currents are shown in FIG. 16 is the shunt switch in FIG. 11 in which the resistance values of the gate resistors RG1 to RG10 (corresponding to the gate resistors RG1 to RG5 and RG5 to RG1 in FIG. 11) are set as described in this application.

As can be seen from FIG. 15 for the shunt switch of the related art, the leakage currents of the shunt FETs are significantly different from one another, and therefore differences ΔI between the leakage currents are relatively great.

In contrast, as can be seen from FIG. 16 for the shunt switch of this application, the leakage currents of the shunt FETs connected to the gate resistors RG7 to RG10 (corresponding to the gate resistors RG4 to RG1 on the first ground terminal TG1 side of the reference position in FIG. 11) are similar to each other, so differences ΔI between these leakage currents are relatively small. Also, the leakage currents of the shunt FETs connected to the gate resistors RG1 to RG5 (corresponding to the gate resistors RG1 to RG5 on the first terminal T1 side of the reference position in FIG. 11) are relatively small. A voltage at a reference position at a center point located at a center of the gate resistors RG1 to RG10 (corresponding to the voltage Vx at the reference position at the center point located at the center of the gate resistors RG1 to RG5 and RG5 to RG1 in FIG. 11) is similar to a gate voltage of the shunt FET connected to the gate resistor RG6 (corresponding to the gate resistor RG5 on the first ground terminal TG1 side of the reference position in FIG. 11), so the shunt FET connected to the gate resistor RG6 has no almost leakage current.

In the examples described in this application, by appropriately setting resistance values of a plurality of gate resistors respectively connected to gates of a plurality of stacked FETs in a shunt switch, without adding separate elements to each of the stacked FETs, a voltage applied across the stacked FETs may be uniformly distributed to the plurality of stacked FETs, and differences between leakage currents of the plurality of gate resistors may be reduced. As a result, a number of stacked FETs that need to be included in a shunt switch to withstand a particular voltage applied across the stacked FETs may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio-frequency switch comprising:
   a first series switch comprising a plurality of series field-effect transistors (FETs) connected in series between a first terminal and either a second terminal or a common node;
   a first shunt switch comprising a plurality of shunt FETs connected in series between the first terminal and a first ground terminal; and
   a first shunt gate resistor circuit comprising a plurality of gate resistors respectively connected to gates of the plurality of shunt FETs of the first shunt switch,
   wherein respective resistance values of the plurality of gate resistors of the first shunt gate resistor circuit successively increase in a direction away from the first ground terminal toward the first terminal, and
   each of the plurality of gate resistors of the first shunt gate resistor circuit is directly connected between the gate of a respective one of the plurality of shunt FETs of the first shunt switch and a first shunt gate voltage terminal common to all of the plurality of gate resistors of the first shunt gate resistor circuit.

2. The radio-frequency switch of claim 1, wherein each of the plurality of gate resistors of the first shunt gate resistor circuit has a resistance value determined by the following equation:

$RG1$ $RGm = PV*RG(m-1)$ where m denotes a position number of an m-th shunt FET among the plurality of shunt FETs of the first shunt switch sequentially counted beginning with 1 from a shunt FET closest to the first terminal among the plurality of shunt FETs of the first shunt switch, where RGm is evaluated for m≥2,
   PV is less than 1, and successively decreases as m increases,
   RG1 denotes the resistance value of a gate resistor connected to the gate of the shunt FET closest to the first terminal among the plurality of gate resistors of the first shunt gate resistor circuit, and
   RGm denotes the resistance value of a gate resistor connected to the gate of the m-th shunt FET among the plurality of gate resistors of the first shunt gate resistor circuit.

3. The radio-frequency switch of claim 1, wherein each of the plurality of gate resistors of the first shunt gate resistor circuit has a resistance value determined by the following equation:

$RG1$ $RGm = \{(2n-2m+1)/(2n-2m+3)\}*RG(m-1)$ where n denotes a total number of the plurality of shunt FETs of the first shunt switch, where n≥2,
   m denotes a position number of an m-th shunt FET among the n shunt FETs of the first shunt switch sequentially counted beginning with 1 from a shunt FET closest to the first terminal among the n shunt FETs, where RGm is evaluated for 2≤m≤n,
   RG1 denotes the resistance value of a gate resistor connected to the gate of the shunt FET closest to the first terminal among the plurality of gate resistors of the first shunt gate resistor circuit, and
   RGm denotes the resistance value of a gate resistor connected to the gate of the m-th shunt FET among the plurality of gate resistors of the first shunt gate resistor circuit.

4. The radio-frequency switch of claim 1, further comprising a first shunt body resistor circuit comprising a plurality of body resistors respectively connected to bodies of the plurality of shunt FETs of the first shunt switch.

5. The radio-frequency switch of claim 4, wherein respective resistance values of the plurality of body resistors of the first shunt body resistor circuit successively increase in the direction away from the first ground terminal toward the first terminal.

6. The radio-frequency switch of claim 5, wherein each of the plurality of body resistors of the first shunt body resistor circuit has a resistance value determined by the following equation:

$RB1$ $RBm = PV*RB(m-1)$ where m denotes a position number of an m-th shunt FET among the plurality of shunt FETs of the first shunt switch sequentially counted beginning with 1 from a shunt FET closest to the first terminal among the plurality of shunt FETs of the first shunt switch where RBm is evaluated for m≥2,
   PV is less than 1, and successively decreases as m increases,
   RB1 denotes the resistance value of a body resistor connected to the body of the shunt FET closest to the first terminal among the plurality of body resistors of the first shunt body resistor circuit, and
   RBm denotes the resistance value of a body resistor connected to the body of the m-th shunt FET among the plurality of body resistors of the first shunt body resistor circuit.

7. The radio-frequency switch of claim 5, wherein each of the plurality of body resistors of the first shunt body resistor circuit has a resistance value determined by the following equation:

RB1

$$RBm=\{(2n-2m+1)/(2n-2m+3)\}*RB(m-1)$$

where n denotes a total number of the plurality of shunt FETs of the first shunt switch, where n≥2, m denotes a position number of an m-th shunt FET among the n shunt FETs of the first shunt switch sequentially counted beginning with 1 from a shunt FET closest to the first terminal among the n shunt FETs, where RBm is evaluated for 2≤m≤n, RB1 denotes the resistance value of a body resistor connected to the body of the shunt FET closest to the first terminal among the plurality of body resistors of the first shunt body resistor circuit, and RBm denotes the resistance value of a body resistor connected to the body of the m-th shunt FET among the plurality of body resistors of the first shunt body resistor circuit.

8. The radio-frequency switch of claim 7, wherein the plurality of series FETs of the first series switch are connected in series between the first terminal and the common node, and the radio-frequency switch further comprises:

a second series switch comprising a plurality of series FETs connected in series between the second terminal and the common node;

a second shunt switch comprising a plurality of shunt FETs connected in series between the second terminal and a second ground terminal;

a second shunt gate resistor circuit comprising a plurality of gate resistors respectively connected to gates of the plurality of shunt FETs of the second shunt switch; and a second shunt body resistor circuit comprising a plurality of body resistors respectively connected to bodies of the plurality of shunt FETs of the second shunt switch, wherein respective resistance values of the plurality of gate resistors of the second shunt gate resistor circuit successively increase in a direction away from the second ground terminal toward the second terminal, respective resistance values of the plurality of body resistors of the second shunt body resistor circuit successively increase in the direction away from the second ground terminal toward the second terminal, and each of the plurality of gate resistors of the second shunt gate resistor circuit is directly connected between the gate of a respective one of the plurality of shunt FETs of the second shunt switch and a second shunt gate voltage terminal common to all of the plurality of gate resistors of the second shunt gate resistor circuit.

9. A radio-frequency switch comprising:

a first series switch comprising a plurality of series field-effect transistors (FETs) connected in series between a first terminal and either a second terminal or a common node;

a first shunt switch comprising a plurality of shunt FETs connected in series between the first terminal and a first ground terminal; and a first shunt gate resistor circuit comprising:

a plurality of gate resistors respectively connected between gates of the plurality of shunt FETs of the first shunt switch and a common connection node of the plurality of gate resistors of the first shunt gate resistor circuit; and a common gate resistor connected between the common connection node of the plurality of gate resistors of the first shunt gate resistor circuit and a first shunt gate voltage terminal, wherein a position of a gate resistor located at a center of the plurality of gate resistors of the first shunt gate resistor circuit is designated as a first reference position in response to a total number of the plurality of gate resistors of the first shunt gate resistor circuit being an odd number, and a center point located at the center of the plurality of gate resistors of the first shunt gate resistor circuit is designated as the first reference position in response to the total number of the plurality of gate resistors of the first shunt gate resistor circuit being an even number, respective resistance values of gate resistors located on a first terminal side of the first reference position among the plurality of gate resistors of the first shunt gate resistor circuit successively increase in a direction away from the first reference position toward the first terminal, and respective resistance values of gate resistors located on a first ground terminal side of the first reference position among the plurality of gate resistors of the first shunt gate resistor circuit successively increase in a direction away from the first reference position toward the first ground terminal.

10. The radio-frequency switch of claim 9, wherein among the plurality of gate resistors of the first shunt gate resistor circuit, each of the gate resistors located on the first terminal side of the first reference position and each of the gate resistors located on the first ground terminal side of the first reference position has a resistance value determined by the following equation:

RG1'

$$RGm'=PV'*RG(m'-1)$$

where m' denotes a position number of an m'-th shunt FET among the plurality of shunt FETs of the first shunt switch sequentially counted beginning with 1 from a shunt FET closest to the first terminal among the plurality of shunt FETs of the first shunt switch toward the first reference position, and also sequentially counted beginning with 1 from a shunt FET closest to the first ground terminal among the plurality of shunt FETs of the first shunt switch toward the first reference position, where RGm' is evaluated for m≥2, PV' is less than 1, and successively decreases as m' increases, RG1' denotes the resistance value of a gate resistor connected to the gate of the shunt FET closest to the first terminal among the plurality of gate resistors of the first shunt gate resistor circuit, and also denotes the resistance value of a gate resistor connected to the gate of the shunt FET closest to the first ground terminal among the plurality of gate resistors of the first shunt gate resistor circuit, and RGm' denotes the resistance value of a gate resistor connected to the gate of the m'-th shunt FET located on the first terminal side of the first reference position among the plurality of gate resistors of the first shunt gate resistor circuit, and also denotes the resistance value of a gate resistor connected to the gate of the m'-th shunt FET located on the first ground terminal side of the first reference position among the plurality of gate resistors of the first shunt gate resistor circuit.

11. The radio-frequency switch of claim 9, wherein among the plurality of gate resistors of the first shunt gate resistor circuit, each of the gate resistors located on the first terminal side of the first reference position and each of the gate resistors located on the first ground terminal side of the first reference position has a resistance value determined by the following equation:

$$RG1'$$

$$RGm'=\{(2n'-2m'+1)/(2n'-2m'+3)\}*RG(m'-1)$$

where n' denotes a total number of shunt FETs located on the first terminal side of the first reference position among the plurality of shunt FETs of the first shunt switch, and also denotes a total number of shunt FETs located on the first ground terminal side of the first reference position among the plurality of shunt FETs of the first shunt switch, where n'≥2, m' denotes a position number of an m'-th shunt FET among the n' shunt FETs located on the first terminal side of the first reference position sequentially counted beginning with 1 from a shunt FET closest to the first terminal among the shunt FETs of the first shunt switch toward the first reference position, and also denotes a position number of an m'-th shunt FET among the n' shunt FETs located on the first ground terminal side of the first reference position sequentially counted beginning with 1 from a shunt FET closest to the first ground terminal among the plurality of shunt FETs of the first shunt switch toward the first reference position, where RGm' is evaluated for 2≤m'≤n', RG1' denotes the resistance value of a gate resistor connected to the gate of the shunt FET closest to the first terminal among the plurality of gate resistors of the first shunt gate resistor circuit, and also denotes the resistance value of a gate resistor connected to the gate of the shunt FET closest to the first ground terminal among the plurality of gate resistors of the first shunt gate resistor circuit, and RGm' denotes the resistance value of a gate resistor connected to the gate of the m'-th shunt FET located on the first terminal side of the first reference position among the plurality of gate resistors of the first shunt gate resistor circuit, and also denotes the resistance value of a gate resistor connected to the gate of the m'-th shunt FET located on the first ground terminal side of the first reference position among the plurality of gate resistors of the first shunt gate resistor circuit.

12. The radio-frequency switch of claim 9, further comprising a first shunt body resistor circuit comprising:

a plurality of body resistors respectively connected between bodies of the plurality of shunt FETs of the first shunt switch and a common connection node of the plurality of body resistors; and a common body resistor connected between the common connection node of the plurality of body resistors and a first shunt body voltage terminal.

13. The radio-frequency switch of claim 12, wherein a position of a body resistor located at a center of the plurality of body resistors of the first shunt body resistor circuit is designated as a second reference position in response to a total number of the plurality of body resistors of the first shunt body resistor circuit being an odd number, and a center point located at the center of the plurality of body resistors of the first shunt body resistor circuit is designated as the second reference position in response to the total number of the plurality of body resistors of the first shunt body resistor circuit being an even number, respective resistance values of body resistors located on a first terminal side of the second reference position among the plurality of body resistors successively increase in a direction away from the second reference position toward the first terminal, and respective resistance values of body resistors located on a first ground terminal side of the second reference position among the plurality of body resistors successively increase in a direction away from the second reference position toward the first ground terminal.

14. The radio-frequency switch of claim 13, wherein among the plurality of body resistors of the first shunt body resistor circuit, each of the body resistors located on the first terminal side of the second reference position and each of the body resistors located on the first ground terminal side of the second reference position has a resistance value determined by the following equation:

$$RB1'$$

$$RBm'=PV'^{*}RB(m'-1)$$

where m' denotes a position number of an m'-th shunt FET among the plurality of shunt FETs of the first shunt switch sequentially counted beginning with 1 from a shunt FET closest to the first terminal among the plurality of shunt FETs of the first shunt switch toward the second reference position, and also sequentially counted beginning with 1 from a shunt FET closest to the first ground terminal among the plurality of shunt FETs of the first shunt switch toward the second reference position, where RBm' is evaluated for m'≥2

PV' is less than 1, and successively decreases as m' increases,

RB1' denotes the resistance value of a body resistor connected to the body of the shunt FET closest to the first terminal among the plurality of body resistors of the first shunt body resistor circuit, and also denotes the resistance value of a body resistor connected to the body of the shunt FET closest to the first ground terminal among the plurality of body resistors of the first shunt body resistor circuit, and RBm' denotes the resistance value of a body resistor connected to the body of the m'-th shunt FET located on the first terminal side of the second reference position among the plurality of body resistors of the first shunt body resistor circuit, and also denotes the resistance value of a body resistor connected to the body of the m'-th shunt FET located on the first ground terminal side of the second reference position among the plurality of body resistors of the first shunt body resistor circuit.

15. The radio-frequency switch of claim 13, wherein among the plurality of body resistors of the first shunt body resistor circuit, each of the body resistors located on the first terminal side of the second reference position and each of the body resistors located on the first ground terminal side of the second reference position has a resistance value determined by the following equation:

$$RB1'$$

$$RBm'=\{(2n'-2m'+1)/(2n'-2m'+3)\}*RB(m'-1)$$

where n' denotes a total number of shunt FETs located on the first terminal side of the second reference position among the shunt FETs of the first shunt switch, and also denotes a total number of shunt FETs located on the first ground terminal side of the second reference position among the shunt FETs of the first shunt switch, where n'≥2, m' denotes a position number of an m'-th shunt FET among the n' shunt FETs located on the first terminal side of the second reference position sequentially counted beginning with 1 from a shunt FET closest to the first terminal toward the second reference position, and also denotes a position number of an m'-th shunt FET among the n' shunt FETs located on the first ground terminal side of the second reference position sequentially counted beginning with 1 from the shunt FET closest to the first ground terminal toward the second reference position, where RBm' is evaluated for 2≤m'≤n', RB1' denotes the resistance value of a body resistor connected to the body of the shunt FET closest to the first terminal among the plurality of body resistors of the first shunt body resistor circuit, and also denotes the resistance value of a body resistor connected to the body of the shunt FET closest to the first ground terminal among the plurality of body resistors of the first shunt body resistor circuit, and RBm' denotes the resistance value of a body resistor connected to the body of the m'-th shunt FET located on the first terminal side of the first reference position among the plurality of body resistors of the first shunt body resistor circuit, and also denotes the resistance value of a body resistor connected to the body of the m'-th shunt FET located on the first ground terminal side of the first reference position among the plurality of body resistors of the first shunt body resistor circuit.

16. The radio-frequency switch of claim 9, wherein the plurality of series FETs of the first series switch are connected in series between the first terminal and the common node, and the radio-frequency switch further comprises:
a second series switch comprising a plurality of series FETs connected in series between the second terminal and the common node;
a second shunt switch comprising a plurality of shunt FETs connected in series between the second terminal and a second ground terminal; and
a second shunt gate resistor circuit comprising a plurality of gate resistors respectively connected to gates of the plurality of shunt FETs of the second shunt switch,
wherein a position of a gate resistor located at a center of the plurality of gate resistors of the second shunt gate resistor circuit is designated as a third reference position in response to a total number of the plurality of gate resistors of the second shunt gate resistor circuit being an odd number, and a center point located at the center of the plurality of gate resistors of the second shunt gate resistor circuit is designated as the third reference position in response to the total number of the plurality of gate resistors of the second shunt gate resistor circuit being an even number,
respective resistance values of gate resistors located on a second terminal side of the third reference position among the plurality of gate resistors of the second shunt gate resistor circuit successively increase in a direction away from the third reference position toward the second terminal, and
respective resistance values of gate resistors located on a second ground terminal side of the third reference position among the plurality of gate resistors of the second shunt gate resistor circuit successively increase in a direction away from the third reference position toward the second ground terminal.

17. The radio-frequency switch of claim 16, further comprising a second shunt body resistor circuit comprising a plurality of body resistors respectively connected to bodies of the plurality of shunt FETs of the second shunt switch,
wherein a position of a body resistor located at a center of the plurality of body resistors of the second shunt body resistor circuit is designated as a fourth reference position in response to a total number of the plurality of body resistors of the second shunt body resistor circuit being an odd number, and a center point located at the center of the plurality of body resistors of the second shunt body resistor circuit is designated as the fourth reference position in response to the total number of the plurality of body resistors of the second shunt body resistor circuit an even number,
respective resistance values of body resistors located on a second terminal side of the fourth reference position among the plurality of body resistors of the second shunt body resistor circuit successively increase in a direction away from the fourth reference position toward the second terminal, and
respective resistance values of body resistors located on a second ground terminal side of the fourth reference position among the plurality of body resistors of the second shunt body resistor circuit successively increase in a direction away from the fourth reference position toward the second ground terminal.

18. A radio-frequency switch comprising:
a series switch comprising a plurality of series field-effect transistors (FETs) connected in a series connection between a first terminal and either a second terminal or a common node;
a shunt switch comprising a plurality of shunt FETs connected in a series connection between the first terminal and a first ground terminal; and
a shunt gate resistor circuit comprising a plurality of gate resistors respectively connected between gates of the plurality of shunt FETs of the shunt switch and a shunt gate voltage terminal common to all of the plurality of gate resistors of the shunt gate resistor circuit,
wherein a respective resistance value of each gate resistor among the plurality of gate resistors depends on a total number of the plurality of shunt FETs, and a position of a corresponding shunt FET to which the gate resistor is connected among the plurality of shunt FETs in the series connection of the plurality of shunt FETs between the first terminal and the first ground terminal, and
each of the plurality of gate resistors of the shunt gate resistor circuit is directly connected between the gate of a respective one of the plurality of shunt FETs of the shunt switch and the shunt gate voltage terminal.

19. The radio-frequency switch of claim 18, wherein the respective resistance values of the plurality of gate resistors successively decrease in a direction away from the first terminal toward the first ground terminal.

20. The radio-frequency switch of claim 18, further comprising a shunt body resistor circuit comprising a plurality of body resistors respectively connected between bodies of the plurality of shunt FETs and a shunt body voltage terminal,
wherein a respective resistance value of each body resistor among the plurality of body resistors depends on the total number of the plurality of shunt FETs, and a position of a corresponding shunt FET to which the body resistor is connected among the plurality of shunt FETs in the series connection of the plurality of shunt FETs between the first terminal and the first ground terminal.

21. The radio-frequency switch of claim 20, wherein the respective resistance values of the plurality of body resistors successively decrease in the direction away from the first terminal toward the first ground terminal.

22. A radio-frequency switch comprising:
a series switch comprising a plurality of series field-effect transistors (FETs) connected in a series connection between a first terminal and either a second terminal or a common node;
a shunt switch comprising a plurality of shunt FETs connected in a series connection between the first terminal and a first ground terminal; and
a shunt gate resistor circuit comprising:
    a plurality of gate resistors respectively connected between gates of the plurality of shunt FETs and a common connection node of the plurality of gate resistors; and
    a common gate resistor connected between the common connection node of the plurality of gate resistors and a shunt gate voltage terminal,
wherein a position of a gate resistor located at a center of the plurality of gate resistors is designated as a first reference position in response to a total number of the plurality of gate resistors being an odd number, and a center point located at the center of the plurality of gate resistors is designated as the first reference position in response to the total number of the plurality of gate resistors being an even number,
a respective resistance value of each gate resistor located on a first terminal side of the first reference position among the plurality of gate resistors depends on a total number of shunt FETs connected in series on the first terminal side of the first reference position among the plurality of shunt FETs connected in the series connection between the first terminal and the first ground terminal, and a position of a corresponding shunt FET to which the gate resistor located on the first terminal side of the first reference position is connected among the shunt FETs connected in series on the first terminal side of the first reference position, and
a respective resistance value of each gate resistor located on a first ground terminal side of the first reference position among the plurality of gate resistors depends on a total number of shunt FETs connected in series on the first ground terminal side of the first reference position among the plurality of shunt FETs connected in the series connection between the first terminal and the first ground terminal, and a position of a corresponding shunt FET to which the gate resistor located on the first ground terminal side of the first reference position is connected among the shunt FETs connected in series on the first ground terminal side of the first reference position.

23. The radio-frequency switch of claim 22, wherein the respective resistance values of the gate resistors located on the first terminal side of the first reference position successively decrease in a direction away from the first terminal toward the first reference position, and
the respective resistance values of the gate resistors located on the first ground terminal side of the first reference position successively decrease in a direction away from the first ground terminal toward the first reference position.

24. The radio-frequency switch of claim 22, further comprising a shunt body resistor circuit comprising:
a plurality of body resistors respectively connected between bodies of the plurality of shunt FETs and a common connection node of the plurality of body resistors; and
a common body resistor connected between the common connection node of the plurality of body resistors and a shunt body voltage terminal,
wherein a position of a body resistor located at a center of the plurality of body resistors is designated as a second reference position in response to a total number of the plurality of body resistors being an odd number, and a center point located at the center of the plurality of body resistors is designated as the second reference position in response to the total number of the plurality of body resistors being an even number,
a respective resistance value of each body resistor located on a first terminal side of the second reference position among the plurality of body resistors depends on a total number of shunt FETs connected in series on the first terminal side of the second reference position among the plurality of shunt FETs connected in the series connection between the first terminal and the first ground terminal, and a position of a corresponding shunt FET to which the body resistor located on the first terminal side of the second reference position is connected among the shunt FETs connected in series on the first terminal side of the second reference position, and
a respective resistance value of each body resistor located on a first ground terminal side of the second reference position among the plurality of body resistors depends on a total number of shunt FETs connected in series on the first ground terminal side of the second reference position among the plurality of shunt FETs connected in the series connection between the first terminal and the first ground terminal, and a position of a corresponding shunt FET to which the body resistor located on the first ground terminal side of the second reference position is connected among the shunt FETs connected in series on the first ground terminal side of the second reference position.

25. The radio-frequency switch of claim 24, wherein the respective resistance values of the body resistors located on the first terminal side of the second reference position successively decrease in the direction away from the first terminal toward the second reference position, and
the respective resistance values of the body resistors located on the first ground terminal side of the second reference position successively decrease in the direction away from the first ground terminal toward the second reference position.

* * * * *